(12) United States Patent
Abe

(10) Patent No.: US 8,703,582 B2
(45) Date of Patent: Apr. 22, 2014

(54) LASER PROCESSING METHOD

(75) Inventor: Yoshinori Abe, Ichihara (JP)

(73) Assignee: Toyoda Gosei Co., Ltd., Aichi-ken (JP)

(*) Notice: Subject to any disclaimer, the term of this patent is extended or adjusted under 35 U.S.C. 154(b) by 377 days.

(21) Appl. No.: 13/160,062

(22) Filed: Jun. 14, 2011

(65) Prior Publication Data
US 2011/0312193 A1    Dec. 22, 2011

(30) Foreign Application Priority Data
Jun. 16, 2010   (JP) ................. 2010-137525

(51) Int. Cl.
*H01L 21/00*   (2006.01)
*H01L 21/26*   (2006.01)
*H01L 21/42*   (2006.01)
*H01L 21/66*   (2006.01)

(52) U.S. Cl.
USPC ............. 438/463; 438/33; 438/535; 438/795; 257/E21.135; 257/E21.347; 257/E21.599

(58) Field of Classification Search
USPC .......................... 438/33, 535, 795, 0.33, 463; 257/E21.135, E21.347
See application file for complete search history.

(56) References Cited

U.S. PATENT DOCUMENTS

| | | |
|---|---|---|
| 2005/0202596 A1 | 9/2005 | Fukuyo et al. |
| 2006/0011593 A1 | 1/2006 | Fukuyo et al. |
| 2006/0148212 A1 | 7/2006 | Fukuyo et al. |
| 2007/0111481 A1 | 5/2007 | Tamura et al. |
| 2007/0158314 A1 | 7/2007 | Fukumitsu et al. |
| 2007/0298529 A1 | 12/2007 | Maeda et al. |
| 2009/0166808 A1 | 7/2009 | Sakamoto et al. |
| 2010/0015783 A1 | 1/2010 | Fukuyo et al. |
| 2010/0055887 A1* | 3/2010 | Piwczyk ................ 438/535 |
| 2011/0306182 A1 | 12/2011 | Fukuyo et al. |
| 2012/0205358 A1 | 8/2012 | Fukuyo et al. |
| 2012/0329248 A1 | 12/2012 | Fukuyo et al. |
| 2013/0252402 A1 | 9/2013 | Fukuyo et al. |
| 2013/0252403 A1 | 9/2013 | Fukuyo et al. |

FOREIGN PATENT DOCUMENTS

| | | |
|---|---|---|
| JP | 2007-136554 A | 6/2007 |
| JP | 2007-165850 A | 6/2007 |
| JP | 2008-098465 A | 4/2008 |
| WO | 2005/098916 A1 | 10/2005 |

* cited by examiner

*Primary Examiner* — Mohsen Ahmadi
(74) *Attorney, Agent, or Firm* — Sughrue Mion, PLLC

(57) ABSTRACT

An element-group formation substrate (20) having plural semiconductor light emitting elements (21) formed on a substrate front surface (11*a*) is sequentially irradiated with a laser beam (64) having a first output from a substrate back surface (11*b*) side in the y direction, and the laser beam (64) is sequentially collected to a part having a first depth D1 from the substrate back surface (11*b*), thereby forming a first modified region L1. The substrate (20) having the first modified region L1 formed therein is sequentially irradiated with the laser beam (64) having a third output (<the first output) from the substrate back surface 11*b* side in the y direction, and the laser beam (64) is sequentially collected to a part having a third depth D3 from the substrate back surface (11*b*) shallower than the first depth D1, thereby forming a third modified region L3.

20 Claims, 14 Drawing Sheets

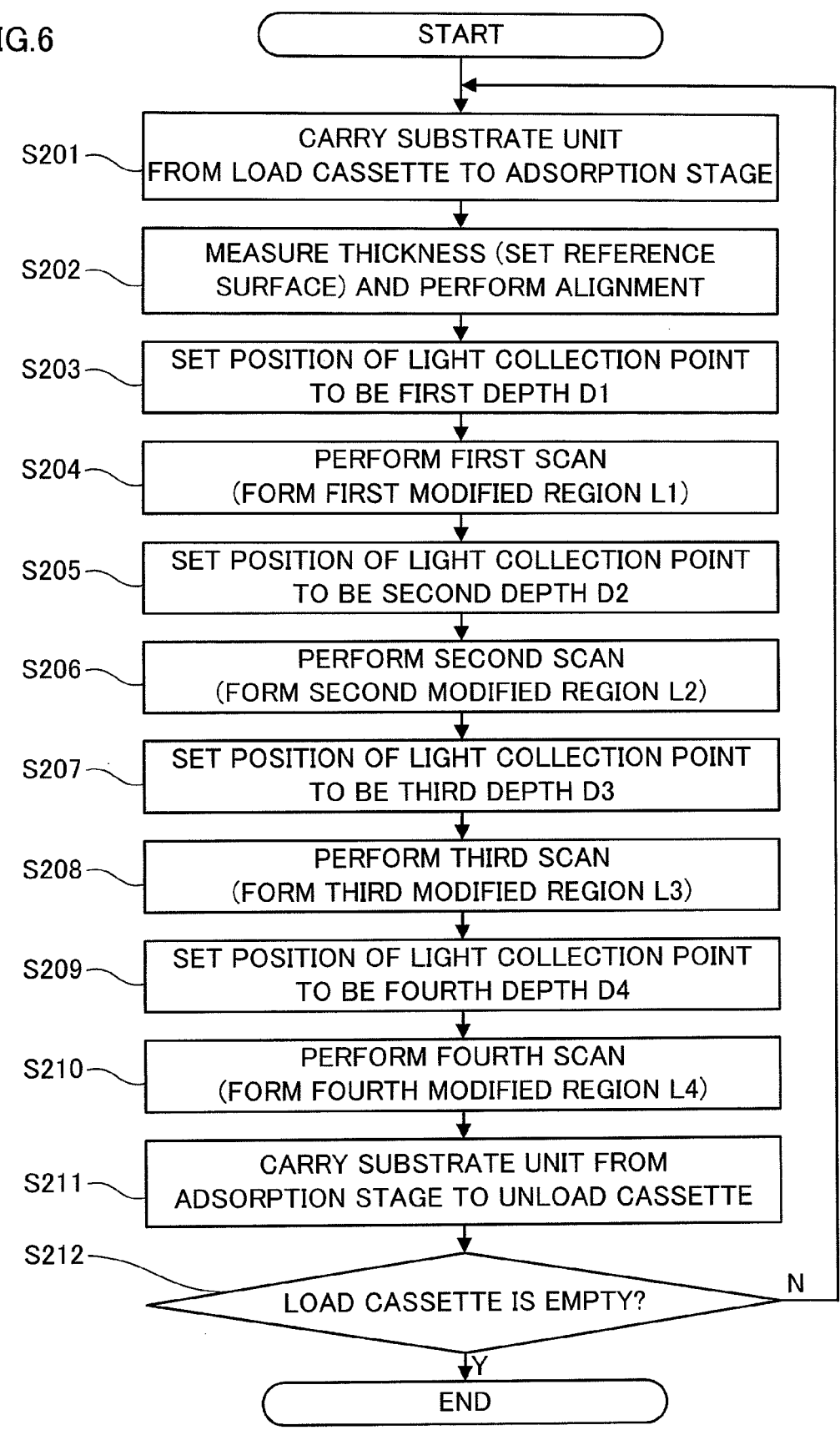

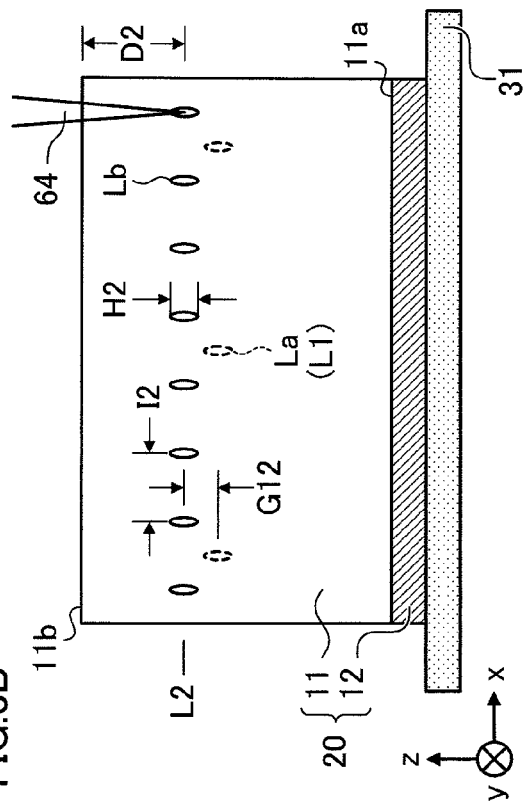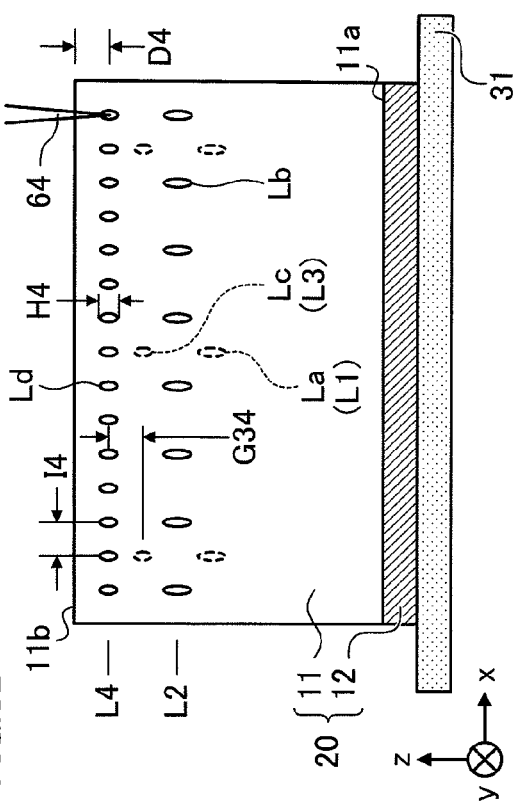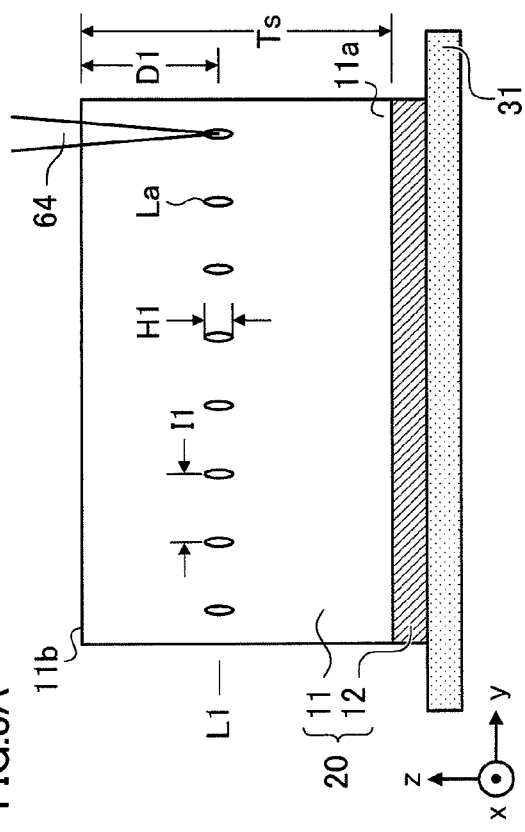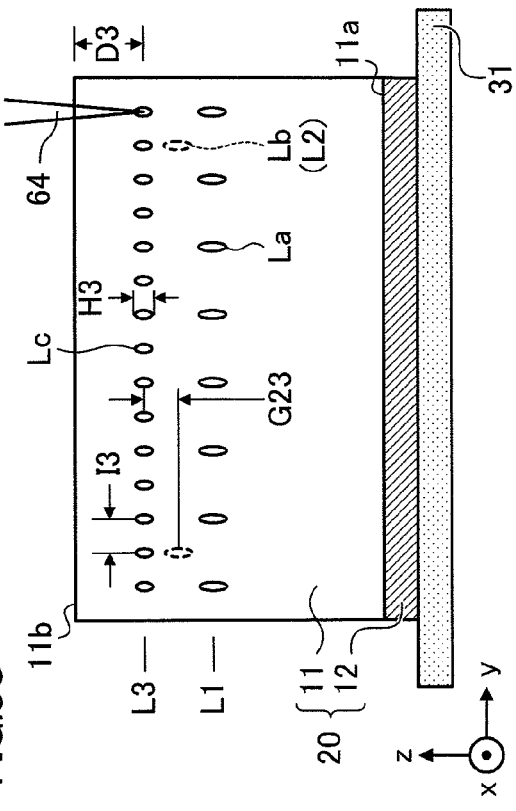

FIG.9

| | SCAN DIRECTION OF LASER BEAM | OUTPUT OF LASER BEAM | DEPTH OF MODIFIED REGION | INTERVAL OF ADJACENT MODIFIED PORTIONS | HEIGHT OF MODIFIED PORTIONS | INTERVAL OF ADJACENT MODIFIED REGIONS |
|---|---|---|---|---|---|---|
| FIRST SCAN (FIRST MODIFIED REGION L1) | Sc1 (y, -y) | P1 | D1 | I1 | H1 | G12 |
| SECOND SCAN (SECOND MODIFIED REGION L2) | Sc2 (x, -x) | P2 | D2 | I2 | H2 | G23 |
| THIRD SCAN (THIRD MODIFIED REGION L3) | Sc3 (y, -y) | P3 | D3 | I3 | H3 | G34 |
| FOURTH SCAN (FOURTH MODIFIED REGION L4) | Sc4 (x, -x) | P4 | D4 | I4 | H4 | |

FIG.14A

| NUMBER | FIRST MODIFIED REGION L1 | SECOND MODIFIED REGION L2 | THIRD MODIFIED REGION L3 | FOURTH MODIFIED REGION L4 | OUTPUT OF LASER | INTERVAL OF MODIFIED PORTIONS |
|---|---|---|---|---|---|---|
| (1) | x | x | x | y | P1>P2>P3 | I1>I2>I3 |
| (2) | x | x | y | x | P1>P2>P4 | I1>I2>I4 |
| (3) | x | y | y | x | P1>P2 P3>P4 | I1>I2 I3>I4 |
| (4) | x | y | x | y | P1>P3>P4 | I1>I3>I4 |
| (5) | x | x | y | y | P1>P3 P2>P4 | I1>I3 I2>I4 |
| (6) | x | y | x | x | P1>P4 P2>P3 | I1>I4 I2>I3 |
| (7) | y | x | x | y | P2>P3>P4 | I2>I3>I4 |
| (8) | y | x | y | x | P2>P3>P4 | I2>I3>I4 |
| (9) | y | y | x | x | P1>P4 P2>P3 | I1>I4 I2>I3 |
| (10) | y | x | y | y | P1>P3 P2>P4 | I1>I3 I2>I4 |
| (11) | y | y | x | y | P1>P3>P4 | I1>I3>I4 |
| (12) | y | y | y | x | P1>P2 P3>P4 | I1>I2 I3>I4 |
| (13) | y | x | y | y | P1>P2>P4 | I1>I2>I4 |
| (14) | y | y | y | x | P1>P2>P3 | I1>I2>I3 |

FIG.14B

| NUMBER | FIRST MODIFIED REGION L1 | SECOND MODIFIED REGION L2 | THIRD MODIFIED REGION L3 | OUTPUT OF LASER | INTERVAL OF MODIFIED PORTIONS |
|---|---|---|---|---|---|
| (1) | x | x | y | P1>P2 | I1>I2 |
| (2) | x | y | x | P1>P3 | I1>I3 |
| (3) | x | y | y | P2>P3 | I2>I3 |
| (4) | y | x | x | P2>P3 | I2>I3 |
| (5) | y | x | y | P1>P3 | I1>I3 |
| (6) | y | y | x | P1>P2 | I1>I2 |

LASER PROCESSING METHOD

TECHNICAL FIELD

The present invention relates to a method for laser processing to cut (chip) into pieces an element-group formation substrate made by forming plural electronic elements on a substrate.

BACKGROUND ART

There is widely used a method in which an element-group formation substrate made by forming plural electronic elements on a substrate is divided and cut into pieces, thereby obtaining plural element chips.

As a conventional art described in an official gazette, there is a technique in which, in order to separate semiconductor light emitting elements formed on a substrate, pulse laser is collected to a predetermined depth inside of the substrate to form internal modified portions that are not continuous in a direction of a line to be separated, and the internal modified portions are made more than two stages in the depth direction of the substrate (see Patent Literature 1).

CITATION LIST

Patent Literature

Patent Literature 1: Japanese Patent Application Laid-Open Publication No. 2008-98465

SUMMARY OF INVENTION

Technical Problem

However, after the first stage of the modified regions is formed in the substrate by using laser, when the second stage of the modified regions is formed so as to be along the first stage of the modified regions and have a depth in the substrate different from that of the first stage of the modified regions, electronic elements provided for the substrate may be deteriorated by the laser beam for forming the second stage of the modified regions.

An object of the present invention is to prevent deterioration of electronic elements formed on a substrate, when plural modified regions are formed in the substrate by using a laser beam which have different depths in the thickness direction of the substrate.

Solution to Problem

In order to attain the above object, the method for laser processing to which the present invention is applied includes the steps of: forming a front-side modified region inside of a plate-shaped substrate in one direction along a surface of the substrate by irradiating an element-group formation substrate sequentially with a laser beam having a predetermined output from a back surface side of the substrate in the one direction, the element-group formation substrate having plural electronic elements formed on a front surface of the substrate, and collecting the laser beam sequentially to a part inside of the substrate which part has a predetermined depth from the back surface; and forming a back-side modified region inside of the substrate along the front-side modified region by irradiating the element-group formation substrate sequentially with a laser beam having one other output smaller than the predetermined output from the back surface side of the substrate in the one direction along the surface of the substrate, the element-group formation substrate having the front-side modified region formed therein, and collecting the laser beam sequentially to a part inside of the substrate which part has one other depth from the back surface shallower than the predetermined depth.

The step of forming the back-side modified region may include irradiating with the laser beam having the one other output so as to face the front-side modified region formed in the substrate.

The step of forming the front-side modified region may include forming the front-side modified region composed by aligning plural front-side modified portions, by collecting the laser beam which is pulse-oscillating inside of the substrate, to form each of the front-side modified portions at a part having the predetermined depth, and moving an irradiation position of the laser beam on the substrate along the surface of the substrate; and the step of forming the back-side modified region may include forming the back-side modified region composed by aligning plural back-side modified portions, by collecting the laser beam which is pulse-oscillating inside of the substrate, to form each of the back-side modified portions at a part having the one other depth, and moving an irradiation position of the laser beam on the substrate along the surface of the substrate; and an interval between two of the back-side modified portions adjacent in the back-side modified region may be made narrower than an interval between two of the front-side modified portions adjacent in the front-side modified region.

Furthermore, the predetermined depth at which the front-side modified region may be formed is set to be less than a half of a thickness of the substrate from the front surface to the back surface thereof in the step of forming the front-side modified region.

According to another aspect of the present invention, the method for laser processing to which the present invention is applied is a method for laser processing to form, inside of a plate-shaped substrate, plural modified regions extending in one direction along a surface of the substrate by irradiating an element-group formation substrate with a laser beam from a back surface side of the substrate, the element-group formation substrate having plural electronic elements formed on a front surface of the substrate. The method may include the step of forming the plural modified regions in the order from a side of the substrate close to the front surface toward a side thereof far from the front surface, while reducing an output of the laser beam at the time of forming each of the modified regions in the order from the side of the substrate close to the front surface toward the side thereof far from the front surface.

The plural modified regions may be formed so as to overlap with each other in a thickness direction of the substrate.

Each of the plural modified regions may formed by moving the laser beam which is pulse-oscillating in the one direction, and moving the laser beam which is pulse-oscillating in the one direction may provide each of the plural modified regions composed of plural modified portions aligning in the one direction, while intervals between the modified portions adjacent in the one direction in each of the plural modified regions may be narrowed in the order from the side of the substrate close to the front surface toward the side thereof far from the front surface.

Furthermore, the plural modified regions may be formed so as to be closer to the back surface of the substrate than a center in the thickness direction from the front surface of the substrate to the back surface thereof.

The substrate may be formed of sapphire, and each of the plural electronic elements may include a group III nitride semiconductor layer.

Advantageous Effects of Invention

According to the present invention, it is possible to prevent deterioration of electronic elements formed on a substrate, when plural modified regions are formed in the substrate by using a laser beam which have different depths in the thickness direction of the substrate.

BRIEF DESCRIPTION OF DRAWINGS

FIG. 6 is a flowchart showing an example of a processing procedure when the modified region formation step is performed by using the laser processing apparatus;

FIGS. 8A to 8D are diagrams showing an example of formation states of the first modified region to the fourth modified region and an interrelationship therebetween in the modified region formation step;

FIG. 9 is a table showing an example of conditions and results of the first scan (the first modified region) to the fourth scan (the fourth modified region) in the modified region formation step;

FIGS. 14A and 14B are tables for listing configuration examples of the plural modified regions to which the present invention may be applied.

DESCRIPTION OF EMBODIMENTS

An exemplary embodiment of the present invention will be described below in detail with reference to the accompanying drawings. Note that scales of the figures used in the following description are not accurate because components are schematically shown in these figures.

Figure 1:
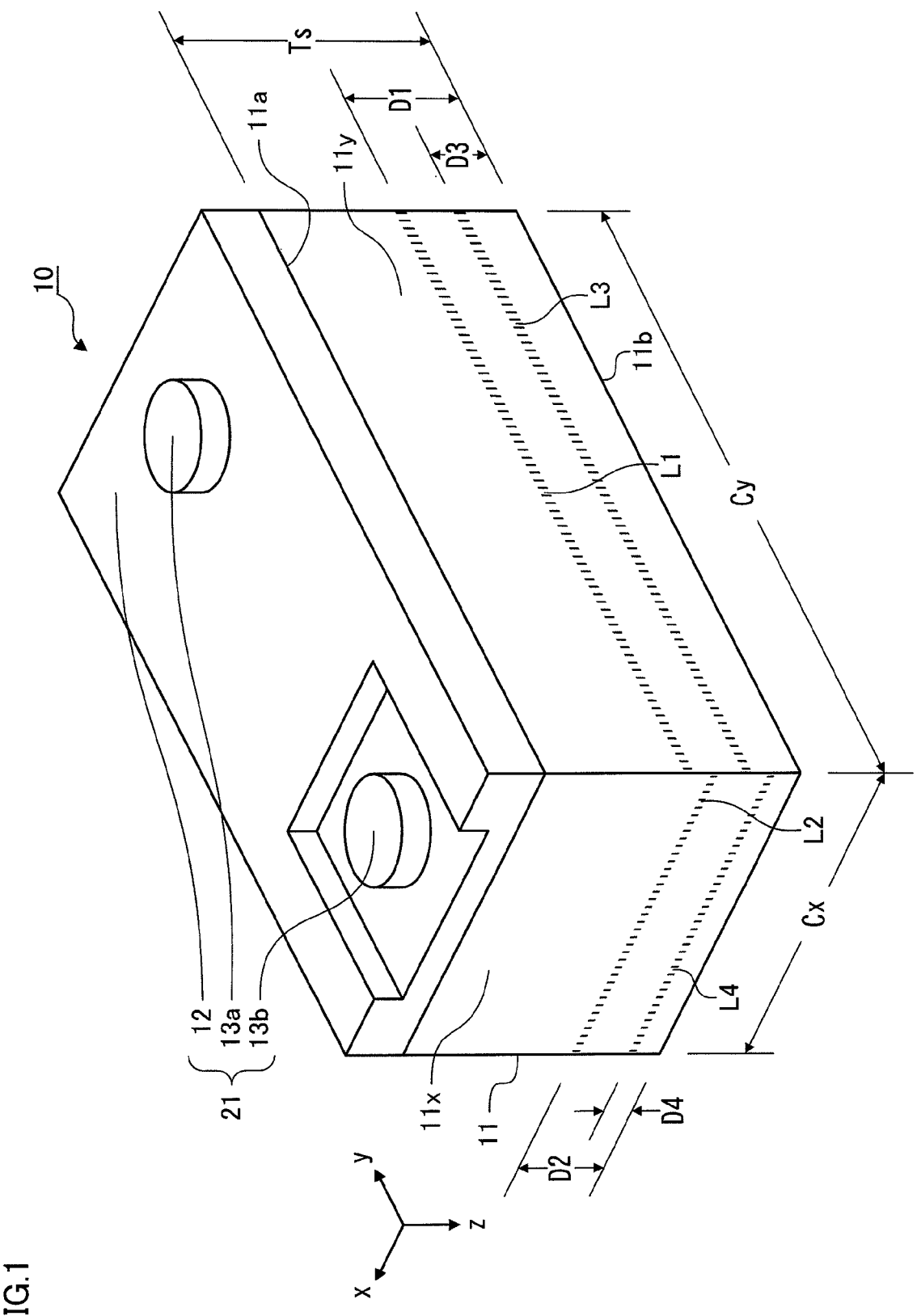
FIG. 1 is a perspective view showing a configuration example of an element chip obtained by using a manufacturing method according to the exemplary embodiment.

FIG. 1 is a perspective view showing a configuration example of an element chip 10 obtained by using a manufacturing method (whose detail will be described later) according to the present exemplary embodiment.

The element chip 10 shown in FIG. 1 is mounted with a semiconductor light emitting element 21 emitting blue light, for example, and has a rectangular shape. The element chip 10 includes: a substrate 11 having a substrate front surface 11a and a substrate back surface 11b that is on the back side of the substrate front surface 11a; a stacked semiconductor layer 12 stacked on the substrate front surface 11a of the substrate 11; and two electrodes 13a and 13b formed on the stacked semiconductor layer 12. The semiconductor light emitting element 21 is composed of the stacked semiconductor layer 12 and the electrodes 13a and 13b.

In the present exemplary embodiment, as the substrate 11, a sapphire single crystal is used which is composed so that the substrate front surface 11a having the stacked semiconductor layer 12 stacked thereon is the C plane. However, the substrate 11 is not limited thereto, but those having a substrate front surface 11a slightly inclined from the C plane, or having another plane as the substrate front surface 11a may be used.

Note that, for example, carbonized silicon (silicon carbide), silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium oxide, tungsten oxide, molybdenum oxide, gallium nitride, and the like may also be used as the substrate 11, instead of sapphire.

On the occasion of composing the semiconductor light emitting element 21 emitting blue light, the stacked semiconductor layer 12 may be composed of a laminate of plural group III nitride semiconductor layers, for example. Sequentially stacking an n-type layer, a light emitting layer and a p-type layer (none of them is shown) composed of a group III nitride semiconductor on the stacked semiconductor layer 12 provides a so-called LED structure. Note that, in this case, an intermediate layer, a base layer (none of them is shown) and the like composed of a group III nitride, for example, may be formed between the stacked surface of the substrate 11 and the n-type semiconductor layer.

Additionally, the electrode 13a is formed on the p-type semiconductor layer side of the stacked semiconductor layer 12, while the electrode 13b is formed on the n-type semiconductor layer side of the stacked semiconductor layer 12. In the element chip 10, feeding a current from the electrode 13a through the unillustrated p-type layer, light emitting layer and n-type layer to the electrode 13b causes light to be emitted from the light emitting layer.

The element chip 10 of the present exemplary embodiment has a rectangular shape, and thus has a longer edge side and a shorter edge side as viewed from above the substrate front surface 11a. Thus, the substrate 11 has four substrate side surfaces other than the substrate front surface 11a and the substrate back surface 11b. Note that, in the following description, the shorter edge side of the element chip 10 is referred to as an x direction, and the longer edge side thereof is referred to as a y direction. The direction that is orthogonal to the x direction and the y direction and extends from the stacked semiconductor layer 12 toward the substrate 11 in the element chip 10 is referred to as a z direction.

Furthermore, in the following description, two x-direction cross sections (xz cross sections) of the substrate 11 are referred to as substrate shorter-side surfaces 11x, and two y-direction cross sections (yz cross sections) of the substrate 11 are referred to as substrate longer-side surfaces 11y. The two substrate shorter-side surfaces 11x face each other with the substrate 11 interposed therebetween, while the two substrate longer-side surfaces 11y face each other with the substrate 11 interposed therebetween. FIG. 1 shows only one substrate shorter-side surface 11x and one substrate longer-side surface 11y adjacent thereto. Note that, in the actual element chip 10, the substrate shorter-side surfaces 11x may be deviated from the xz plane, and the substrate longer-side surfaces 11y may be deviated from the yz plane.

In the present exemplary embodiment, there are two streaks on the substrate shorter-side surface 11x of the substrate 11 along the x direction, and two streaks on the substrate longer-side surface 11y of the substrate 11 along the y direction. These four streaks are formed by modification of the sapphire composing the substrate 11 associated with irradiation with a laser beam to be described later. In the following description, on the substrate longer-side surface 11y of the substrate 11, the streak formed closer to the stacked semiconductor layer 12 is referred to as a first modified region L1 and the streak formed farther from the stacked semiconductor layer 12 than the first modified region L1 (closer to the substrate back surface 11b than the first modified region L1) is referred to as a third modified region L3. Meanwhile, on the substrate shorter-side surface 11x of the substrate 11, the streak formed closer to the stacked semiconductor layer 12 is referred to as a second modified region L2 and the streak formed farther from the stacked semiconductor layer 12 than the second modified region L2 (closer to the substrate back surface 11b than the second modified region L2) is referred to as a fourth modified region L4.

Focusing on the positional relationship among the first modified region L1 to the fourth modified region L4, in the present exemplary embodiment, the first modified region L1 (the y direction), the second modified region L2 (the x direction), the third modified region L3 (the y direction) and the fourth modified region L4 (the x direction) are positioned in this order from the side closest to the stacked semiconductor layer 12. Additionally, if the distance in the z direction from the substrate back surface 11b to the first modified region L1, the distance in the z direction from the substrate back surface 11b to the second modified region L2, the distance in the z direction from the substrate back surface 11b to the third modified region L3 and the distance in the z direction from the substrate back surface 11b to the fourth modified region L4 are denoted as a first depth D1, a second depth D2, a third depth D3 and a fourth depth D4, respectively, these have a relationship of D1>D2>D3>D4. Additionally, if the thickness of the substrate 11 in the z direction is denoted as a substrate thickness Ts, the substrate thickness Ts and the first depth D1 have a relationship of D1<Ts/2. Accordingly, the first modified region L1, the second modified region L2, the third modified region L3 and the fourth modified region L4 of the present exemplary embodiment are positioned farther than the center of the thickness of the substrate 11 in the z direction (the substrate thickness Ts), namely, closer to the substrate back surface 11b, as viewed from the substrate front surface 11a, which is the stacked surface of the stacked semiconductor layer 12.

Note that, in the following description, the length of the element chip 10 in the x direction is referred to as a chip shorter thickness Cx, and the length of the element chip 10 in the y direction is referred to as a chip longer thickness Cy. In this example, the chip shorter thickness Cx is 300 µm, while the chip longer thickness Cy is 600 µm. However, the thicknesses are not limited thereto. The sizes of the chip shorter thickness Cx and the chip longer thickness Cy may be changed in design as appropriate, and further, these may satisfy Cx=Cy or Cx>Cy.

Each of the electrodes 13a and 13b has a columnar shape, whose diameter is about 100 µm.

Figure 2:
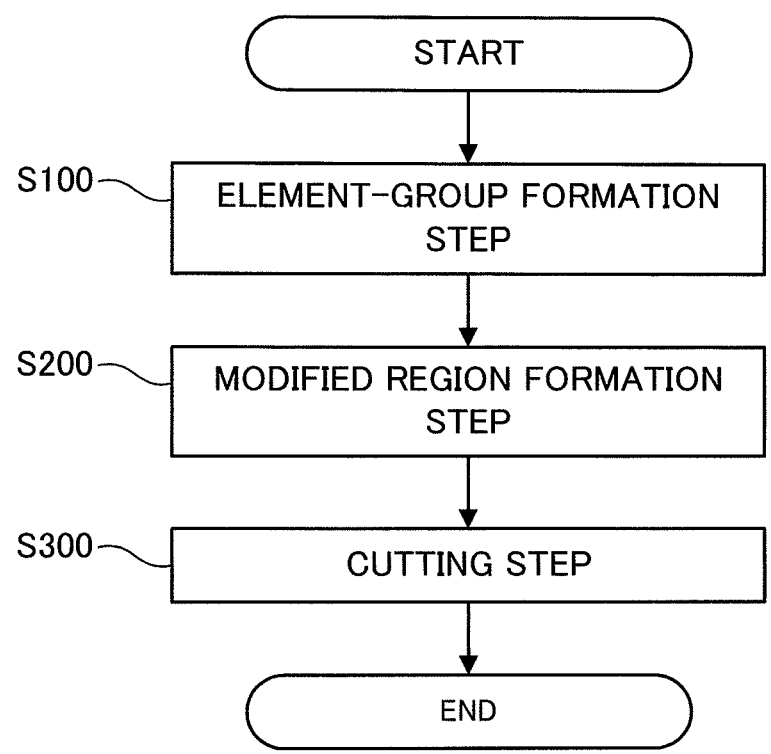
FIG. 2 is a flowchart showing an example of a manufacturing method of the element chip.

FIG. 2 is a flowchart showing an example of a manufacturing method of the element chip 10 shown in FIG. 1.

In this example, first, an element-group formation step is performed to obtain an element-group formation substrate 20 (see FIGS. 3A and 3B to be described later) by forming plural semiconductor light emitting elements 21 on the wafer-like substrate 11 formed of sapphire (Step 100).

Next, a modified region formation step is performed on the element-group formation substrate 20 obtained in Step 100 to form the above-described first modified region L1 to fourth modified region L4 inside of the wafer-like substrate 11 (Step 200).

Then, a cutting step is performed on the element-group formation substrate 20 having the first modified region L1 to the fourth modified region L4 formed inside of the wafer (the substrate 11) to obtain the element chips 10 cut into pieces from the element-group formation substrate 20 by division in which the first modified region L1 to the fourth modified region L4 are used as base points (Step 300).

Figure 3A:
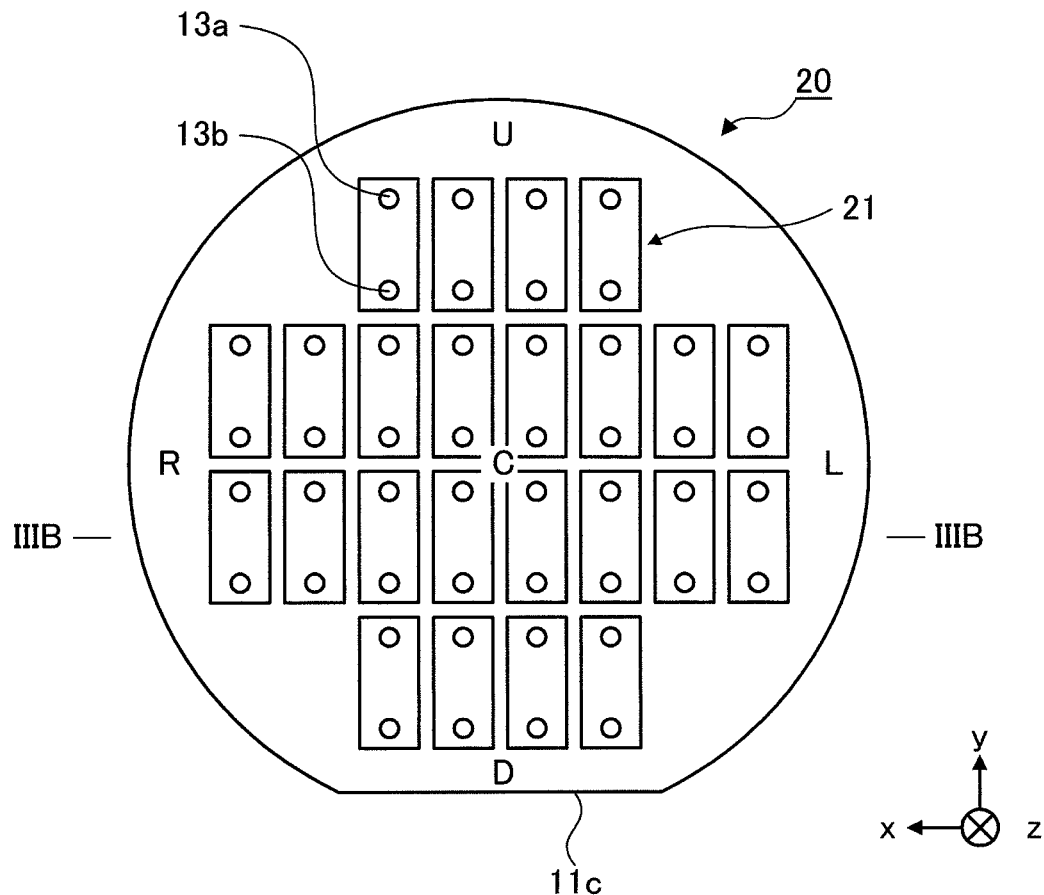
FIGS. 3A and 3B are diagrams showing a configuration example of the element-group formation substrate obtained by performing the element-group formation step.
Figure 3B:
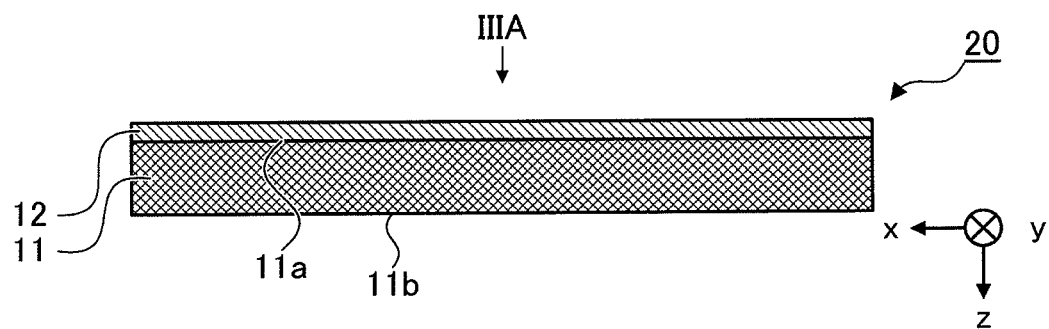

FIGS. 3A and 3B are diagrams showing a configuration example of the element-group formation substrate 20 obtained by performing the element-group formation step of the above-described Step 100. FIG. 3A is a top view of the element-group formation substrate 20 as viewed from a side facing the formation surface of the plural semiconductor light emitting elements 21, while FIG. 3B is a cross-sectional view of FIG. 3A taken along the IIIB-IIIB line. Note that FIG. 3A corresponds to FIG. 3B viewed from the IIIA direction.

The element-group formation substrate 20 includes: the wafer-like substrate 11; the stacked semiconductor layer 12 stacked on almost all of the substrate front surface 11a of the substrate 11; and the plural electrodes 13a and 13b formed on the stacked semiconductor layer 12. As a result, the plural semiconductor light emitting elements 21, which are an example of plural electronic elements, are formed in the form of a matrix on the substrate front surface 11a of the substrate 11.

In this example, single-crystal sapphire oriented in the C axis may be used as the wafer-like substrate 11. For example, the diameter of the sapphire is 4 inches (about 100 mm), and the thickness thereof is 50 µm to 250 µm. At an edge of the wafer-like substrate 11, an orientation flat (OF) 11c is provided which indicates the crystal orientation of the substrate 11 and serves as a reference in a process for forming the plural semiconductor light emitting elements 21 on the substrate 11. In this example, the OF 11c is formed along the [11-20] plane of the sapphire single crystal.

In this example, the plural semiconductor light emitting elements 21 are formed in a state being arranged in the vertical and horizontal directions on the substrate 11 so that the x direction thereof on the substrate 11 is along the OF 11c and the y direction thereof on the substrate 11 is orthogonal to the OF 11c. Accordingly, the plural semiconductor light emitting elements 21 are formed with the shorter edge side thereof extending in the same direction as the OF 11c of the substrate 11 and the longer edge side thereof extending in the direction orthogonal to the OF 11c of the substrate 11. Hereinafter, also for the element-group formation substrate 20, the direction along the OF 11c is referred to as an x direction, and the direction orthogonal to the OF 11c is referred to as a y direction.

Additionally, as shown in FIG. 3A, when the element-group formation substrate 20 is viewed from the stacked semiconductor layer 12 side, the edge on which the OF 11c is provided, the edge opposite to the OF 11c, the right side edge and the left side edge with respect to the OF 11c at the bottom side, and the center portion are referred to as a D edge, a U edge, an L edge, an R edge, and a C portion, respectively. Since irradiation with a laser beam is performed from the substrate back surface 11b side in the modified region formation step of Step 200 as will be described later, FIG. 3A is made so that the R side and the L side are on the left side and the right side, respectively, and the positive x direction extends from the L side to the R side.

Figure 4A:
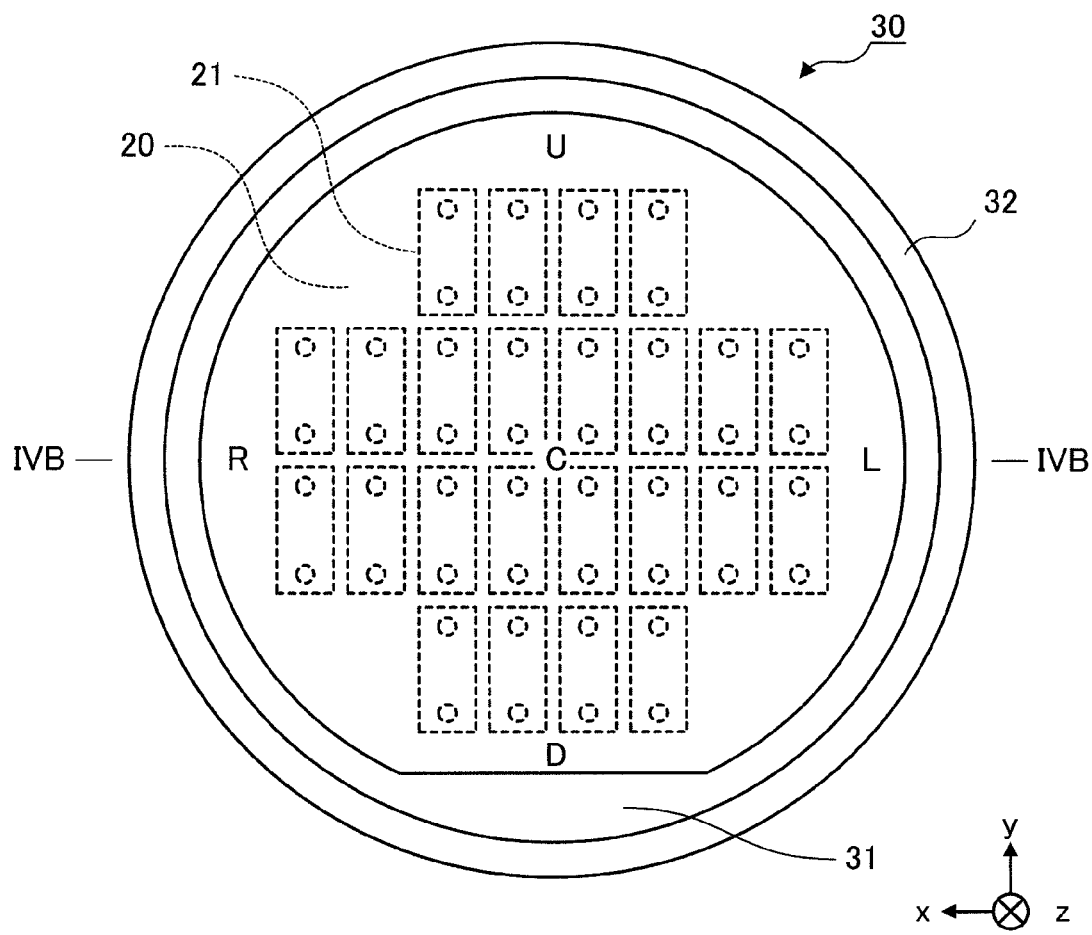
FIGS. 4A and 4B are diagrams showing a configuration example of a substrate unit used in the modified region formation step and the cutting step with the element-group formation substrate attached thereto.
Figure 4B:
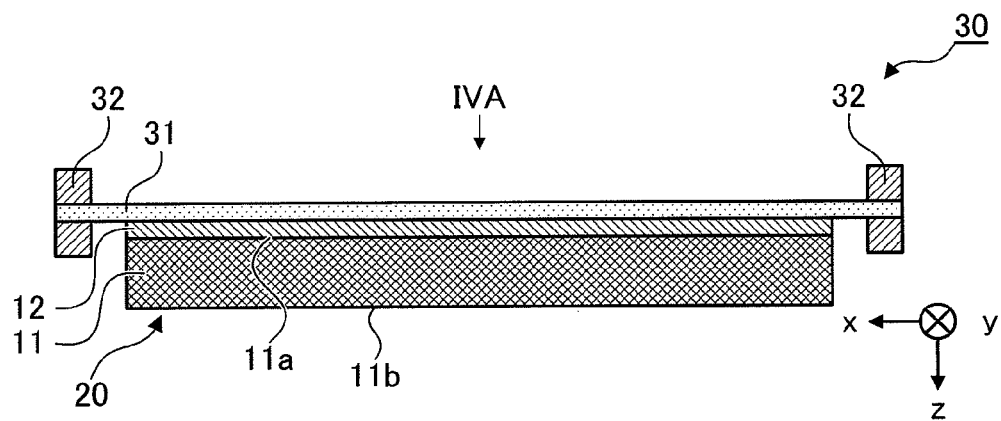

FIGS. 4A and 4B are diagrams showing a configuration example of a substrate unit 30 used with the element-group formation substrate 20 attached thereto in the above-described modified region formation step and cutting step of Steps 200 and 300. FIG. 4A is a top view of the substrate unit 30 as viewed from a side facing the formation surface of the plural semiconductor light emitting elements 21 of the element-group formation substrate 20, while FIG. 4B is a cross-sectional view of FIG. 4A taken along the IVB-IVB line. Note that FIG. 4A corresponds to FIG. 4B viewed from the IVA direction.

The substrate unit 30 includes: an adhesive sheet 31 for sticking the stacked semiconductor layer 12 side (the formation surface side of the plural semiconductor light emitting elements 21) of the element-group formation substrate 20 obtained in Step 100; and a metal ring 32 that has a cylindrical appearance and sandwiches and supports the adhesive sheet 31 to which the element-group formation substrate 20 is stuck. The metal ring 32 has an inner diameter larger than the element-group formation substrate 20, and the element-group formation substrate 20 is stuck on the adhesive sheet 31 so as not to come into contact with the metal ring 32 inside of the metal ring 32. Note that the element-group formation substrate 20 is stuck on the back side of the adhesive sheet 31, and FIG. 4A shows the element-group formation substrate 20 viewed through the adhesive sheet 31. The element-group formation substrate 20 is stuck on the substrate unit 30 in this manner, and thus, in the substrate unit 30, the substrate back surface 11b of the substrate 11 of the element-group formation substrate 20 is exposed to outside.

The adhesive sheet 31 constituting the substrate unit 30 is provided in order to hold the element-group formation substrate 20 and prevent the element chips 10 (see FIG. 1) obtained from the element-group formation substrate 20 from flying out in the modified region formation step of Step 200 and the cutting step of Step 300.

Those obtained by attaching an adhesive material to a base material made of various resin materials, for example, may be used as the adhesive sheet 31. In the present exemplary embodiment, polyethylene terephthalate (PET) having high stiffness is used as the base material of the adhesive sheet 31.

Figure 5:
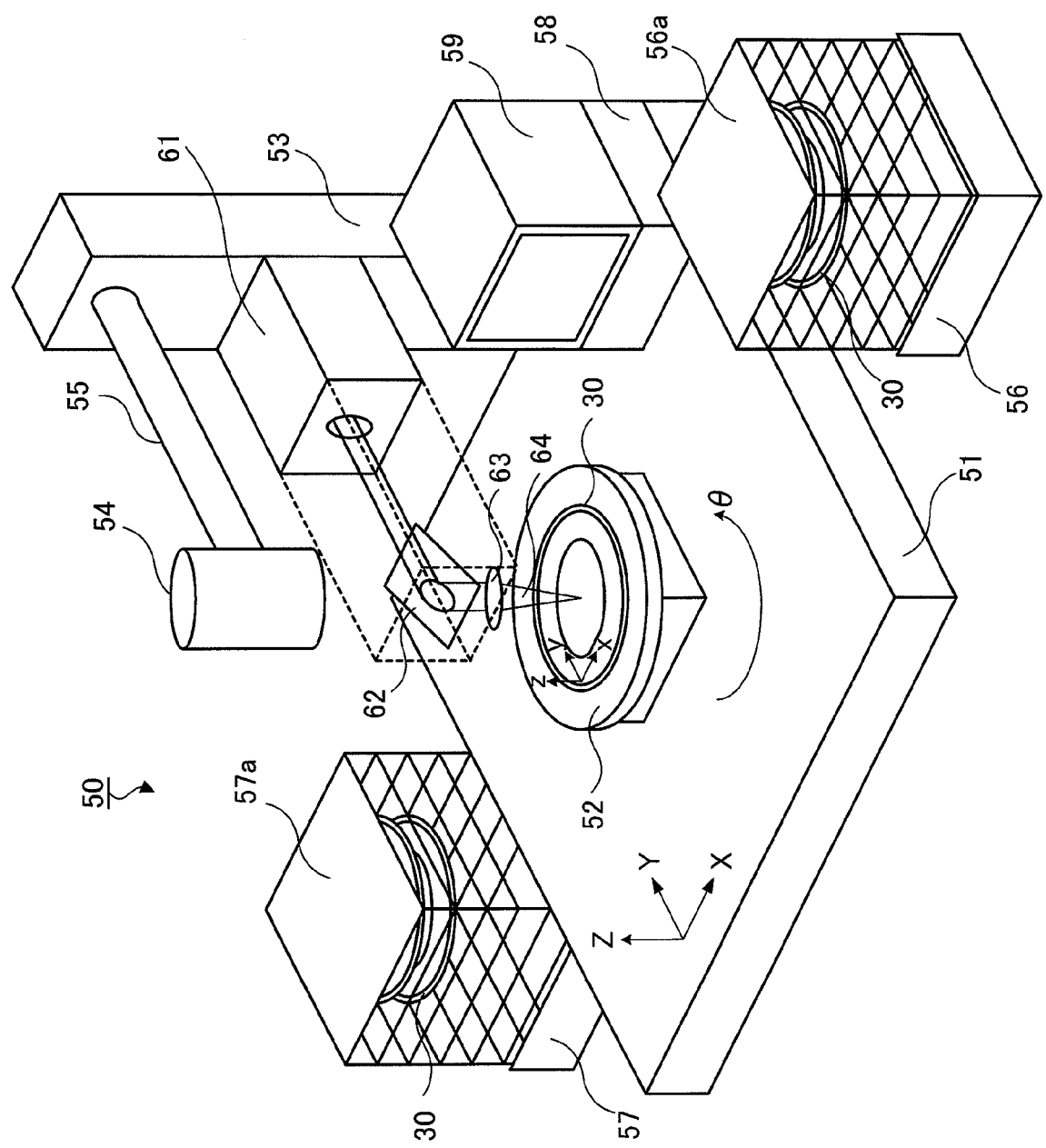
FIG. 5 is a perspective view showing a configuration example of the laser processing apparatus used in the modified region formation step.

FIG. 5 is a perspective view showing a configuration example of the laser processing apparatus 50 used in the modified region formation step of Step 200.

The laser processing apparatus 50 includes: a base 51 for installation on a platform or the like; and an adsorption stage 52 that is provided on the base 51 and is movable on the base 51 in the side-to-side direction (which is referred to as an X direction in the following description), in the front-back direction (which is referred to as a Y direction in the following description), in the up-and-down direction (which is referred to as a Z direction in the following description) and further in the rotation direction (which is referred to as a θ direction in the following description). Note that a motor (not shown) to move the adsorption stage 52 in the X direction, the Y direction and the Z direction and a motor (not shown) to rotate the adsorption stage 52 in the θ direction are incorporated into the base 51.

The adsorption stage 52 provided for the laser processing apparatus 50 performs vacuum adsorption on the substrate unit 30 shown in FIGS. 4A and 4B to fix the substrate unit 30. In this example, the substrate unit 30 is mounted on the adsorption stage 52 so that the x direction and the y direction of the element-group formation substrate 20 respectively coincide with the X direction and the Y direction of the base 51. At this time, the element-group formation substrate 20 is installed on the adsorption stage 52 so that the OF 11c of the substrate 11 is on the front side (on the −Y direction side). As a result, in the element-group formation substrate 20 attached to the substrate unit 30, when the substrate unit 30 is adsorbed to the adsorption stage 52, the substrate back surface 11b of the substrate 11 (on the z direction side: see FIG. 4B) faces upward, namely, on the Z direction side.

Additionally, the laser processing apparatus 50 includes a support 53 that is provided on the base 51 to support a laser-beam generation section 61 generating a laser beam 64 heading in the −Y direction. Note that, FIG. 5 shows the laser-beam generation section 61 partially with broken lines so as to reveal the internal structure thereof. The laser-beam generation section 61 generates pulse-oscillating YAG (Yttrium Aluminum Garnet) laser. The laser-beam generation section 61 is provided with: a dichroic mirror 62 that reflects the laser beam 64 heading in the −Y direction to bend the laser beam 64 in the −Z direction toward the adsorption stage 52; and an optical system 63 that collects the laser beam 64 reflected on the dichroic mirror 62 to cause the laser beam 64 to come into a focus inside of the substrate 11 of the element-group formation substrate 20 (see FIG. 3A) mounted on the adsorption stage 52.

Moreover, the laser processing apparatus 50 has an image pickup section 54 that is arranged above the dichroic mirror 62 to observe the element-group formation substrate 20 mounted on the adsorption stage 52 through the dichroic mirror 62. The image pickup section 54 is attached to an arm 55 extending from the support 53.

Furthermore, the laser processing apparatus 50 further includes: a load cassette elevator 56 accommodating substrate units 30 before being subjected to laser processing; and an unload cassette elevator 57 accommodating substrate units 30 after being subjected to laser processing. The load cassette elevator 56 can accommodate plural load cassettes 56a respectively containing the substrate units 30 before being subjected to laser processing. Meanwhile, the unload cassette elevator 57 can accommodate plural unload cassettes 57a respectively containing the substrate units 30 after being subjected to laser processing. A substrate unit 30 before laser processing contained in a load cassette 56a is carried and set to the adsorption stage 52 by an unillustrated robot arm. Meanwhile, the substrate unit 30 after laser processing is carried from the adsorption stage 52 by an unillustrated robot arm and contained in an unload cassette 57a.

The laser processing apparatus 50 further includes: a controlling section 58 controlling operations of the adsorption stage 52, the load cassette elevator 56, the unload cassette elevator 57, the laser-beam generation section 61 and the like; and a displaying section 59 for displaying an image of the element-group formation substrate 20 picked up by the image pickup section 54, control information from the controlling section 58, and the like.

Now, the above-described modified region formation step of Step 200 is described more specifically.

FIG. 6 is a flowchart showing an example of a processing procedure when the modified region formation step of Step 200 is performed by using the laser processing apparatus 50 shown in FIG. 5.

Now, according to the flowchart shown in FIG. 6, a description is given of the modified region formation step, with reference to FIGS. 3A to 5.

In the laser processing apparatus 50, the controlling section 58 first causes the unillustrated robot arm to carry the first sheet of the substrate units 30 from the load cassette 56a to the adsorption stage 52 (Step 201). The controlling section 58 then causes the adsorption stage 52 to adsorb the substrate unit 30. Then, the controlling section 58 moves the adsorption stage 52 in the X direction and the Y direction and rotates the adsorption stage 52 in the θ direction, to perform simple positioning so that the x direction of the element-group formation substrate 20 provided for the substrate unit 30 faces the X direction of the base 51.

Next, the controlling section 58 measures the thickness of the substrate 11 of the element-group formation substrate 20 provided for the substrate unit 30 and the thickness of the adhesive sheet 31, sets the substrate back surface 11b as a reference surface ("0"), and further performs accurate positioning (alignment) of the element-group formation substrate 20 in the X direction, the Y direction and the θ direction (Step 202). Note that the thickness of the substrate 11 and the thickness of the adhesive sheet 31 can be obtained from the difference between the distances to the light collection point under the presence and absence of the substrate unit 30 measured with the optical system 63. In the accurate positioning, the position of the adsorption stage 52 is set so that lines in the x direction and the y direction to be cut (not shown) which are assumed to pass through the boundary of each of the semiconductor light emitting elements 21 arranged in the element-group formation substrate 20 coincide with irradiation positions of the laser beam 64 in the X direction and the Y direction and that the laser beam 64 is scanned along the lines to be cut which are assumed in the element-group formation substrate 20. This setting may be visually made by an operator of the laser processing apparatus 50, or automatically made by the controlling section 58 on the basis of an image of the element-group formation substrate 20 picked up by the image pickup section 54.

Subsequently, the controlling section 58 sets the light collection point of the laser beam 64 at a position that will have the first depth D1 if the surface height of the substrate back surface 11b is regarded as "0" (Step 203). Note that, in this example, the first depth D1 is set to be less than a half of the substrate thickness Ts (D1<Ts/2). The position adjustment of the light collection point may be made by adjusting the optical system 63 or moving of the adsorption stage 52 in the Z direction.

Next, the controlling section 58 sequentially irradiates the element-group formation substrate 20 with the laser beam 64 in the Y direction and the −Y direction of the base 51, and thereby performs a first scan for forming the first modified region L1 at positions having the first depth D1 in the substrate 11 of the element-group formation substrate 20 along the y direction and the −y direction of the element-group formation substrate 20 (Step 204).

When the formation of the first modified region L1 for the element-group formation substrate 20 is completed, the controlling section 58 sets the light collection point of the laser beam 64 at a position that will have the second depth D2 if the surface height of the substrate back surface 11b is regarded as "0" (Step 205). Note that, in this example, the second depth D2 is set to be shallower than the first depth D1 (D1>D2).

The controlling section 58 sequentially irradiates the element-group formation substrate 20, in which the first modified region L1 has been formed, with the laser beam 64 in the X direction and the −X direction of the base 51 this time, and thereby performs a second scan for forming the second modified region L2 at positions having the second depth D2 in the substrate 11 of the element-group formation substrate 20 along the x direction and the −x direction of the element-group formation substrate 20 (Step 206).

When the formation of the second modified region L2 for the element-group formation substrate 20 is completed, the controlling section 58 sets the light collection point of the laser beam 64 at a position that will have the third depth D3 if the surface height of the substrate back surface 11b is regarded as "0" (Step 207). Note that, in this example, the third depth D3 is set to be shallower than the second depth D2 (D2>D3).

Then, the controlling section 58 sequentially irradiates the element-group formation substrate 20, in which the first modified region L1 and the second modified region L2 have been formed, with the laser beam 64 in the Y direction and the −Y direction of the base 51 this time, and thereby performs a third scan for forming the third modified region L3 at positions having the third depth D3 in the substrate 11 of the element-group formation substrate 20 along the y direction and the −y direction of the element-group formation substrate 20 (Step 208).

When the formation of the third modified region L3 for the element-group formation substrate 20 is completed, the controlling section 58 sets the light collection point of the laser beam 64 at a position that will have the fourth depth D4 if the surface height of the substrate back surface 11b is regarded as "0" (Step 209). Note that, in this example, the fourth depth D4 is set to be shallower than the third depth D3 (D3>D4).

The controlling section 58 sequentially irradiates the element-group formation substrate 20, in which the first modified region L1 to the third modified region L3 have been formed, with the laser beam 64 in the X direction and the −X direction of the base 51 this time, and thereby performs a fourth scan for forming the fourth modified region L4 at positions having the fourth depth D4 in the substrate 11 of the element-group formation substrate 20 along the x direction and the −x direction of the element-group formation substrate 20 (Step 210).

When the formation of the first modified region L1 to the fourth modified region L4 for the substrate 11 of the element-group formation substrate 20 provided for the substrate unit 30 is completed in this manner, the controlling section 58 causes the unillustrated robot arm to carry the first sheet of the substrate units 30 from the adsorption stage 52 to the unload cassette 57a (Step 211).

The controlling section 58 then judges whether or not there is no substrate unit 30 in the load cassettes 56a (whether or not a substrate unit 30 is left in the load cassettes 56a) (Step 212). If it is judged that no substrate unit 30 is left in the load cassettes 56a, formation of plural modified regions by means of the above-described laser processing is finished. On the other hand, if it is judged that a substrate unit 30 is left in the load cassettes 56a, the process returns to Step 201 and starts forming the plural modified regions for the next substrate unit 30. After that, the plural modified regions (in this example, the first modified region L1 to the fourth modified region L4) are formed for all of the substrate units 30 contained in the load cassettes 56a, by a similar procedure.

In the present exemplary embodiment, if the y direction is regarded as "one direction," the first modified region L1 and the third modified region L3 correspond to "a front-side modified region" and "a back-side modified region," respectively. In this case, Step 204 and Step 208 will correspond to "the step of forming the front-side modified region" and "the step of forming the back-side modified region," respectively. Additionally, in this case, the first depth D1 at which the first modified region L1 is formed and the third depth D3 at which the third modified region L3 is formed correspond to "a predetermined depth" and "one other depth," respectively.

Meanwhile, if the x direction is regarded as "one direction," the second modified region L2 and the fourth modified region L4 correspond to "a front-side modified region" and "a back-side modified region," respectively. In this case, Step 206 and Step 210 will correspond to "the step of forming the front-side modified region" and "the step of forming the back-side modified region," respectively. Additionally, in this case, the second depth D2 at which the second modified region L2 is formed and the fourth depth D4 at which the fourth modified region L4 is formed correspond to "a predetermined depth" and "one other depth," respectively.

Next, a description is given of the first scan in Step 204 and the first modified region L1 formed by the first scan, the second scan in Step 206 and the second modified region L2 formed by the second scan, the third scan in Step 208 and the third modified region L3 formed by the third scan, and the fourth scan in Step 210 and the fourth modified region L4 formed by the fourth scan. A description is also given of an interrelationship with regard to the first modified region L1, the second modified region L2, the third modified region L3 and the fourth modified region L4 formed in the substrate 11 of the element-group formation substrate 20.

FIGS. 7A to 7D are diagrams showing an example of the scan directions of the laser beams 64 in forming the first modified region L1 to the fourth modified region L4 in the modified region formation step of Step 200. FIGS. 8A to 8D are diagrams showing an example of formation states of the first modified region L1 to the fourth modified region L4 and an interrelationship therebetween in the modified region formation step. Additionally, FIG. 9 is a table showing an example of conditions and results of the first scan (the first modified region L1) to the fourth scan (the fourth modified region L4) in the modified region formation step.

Figure 7A:
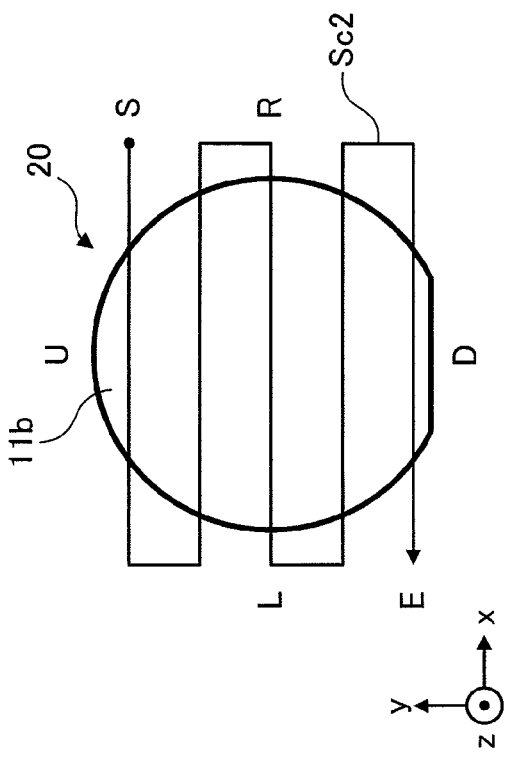
FIGS. 7A to 7D are diagrams showing an example of the scan directions of the laser beams in forming the first modified region to the fourth modified region in the modified region formation step.
Figure 7B:
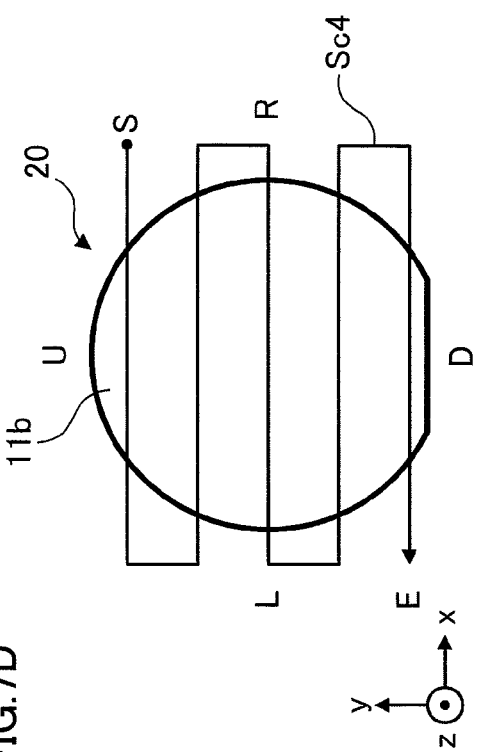
Figure 7C:
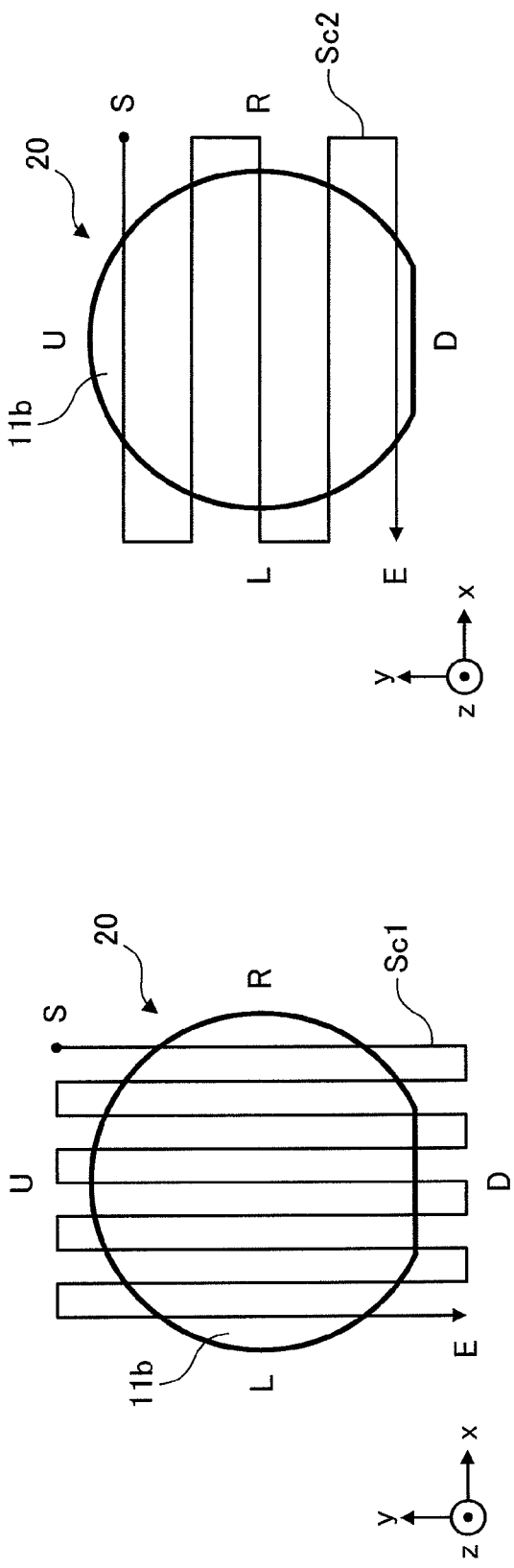

FIGS. 7A and 8A correspond to the first scan (formation of the first modified region L1) in Step 204; FIGS. 7B and 8B correspond to the second scan (formation of the second modified region L2) in Step 206; FIGS. 7C and 8C correspond to the third scan (formation of the third modified region L3) in Step 208; and FIGS. 7D and 8D correspond to the fourth scan (formation of the fourth modified region L4) in Step 210. Hereinafter, a specific description of operations of the laser processing apparatus 50 is omitted, and a description is given by focusing on a relationship between the laser beam 64 emitted from the laser processing apparatus 50 and the element-group formation substrate 20 (the substrate 11) which is a target of irradiation with the laser beam 64.

First, a description is given of the first scan in Step 204 and the first modified region L1 formed in the substrate 11 of the element-group formation substrate 20 by the first scan.

In the first scan, as shown in FIG. 7A, irradiation with the pulse-oscillating laser beam 64 is performed along a first scan line Sc1 extending from a start position S that is at the upper right of the element-group formation substrate 20 in the drawing and outside of the element-group formation substrate 20 to an end position E that is at the lower left of the element-group formation substrate 20 in the drawing and outside of the element-group formation substrate 20. The output of the laser beam 64 per one pulse in the first scan is referred to as a first output P1. By the irradiation with the laser beam 64 along the first scan line Sc1, plural first modified regions L1 are sequentially formed in the element-group formation substrate 20 in the y direction and the −y direction from the R edge side to the L edge side so as to be parallel in the xy plane.

During the first scan, as shown in FIG. 8A, the laser beam 64 enters the element-group formation substrate 20 from the substrate back surface 11b of the substrate 11. The laser beam 64 incident on the substrate 11 in the first scan is collected at a part of the substrate 11 having the first depth D1, which increases the energy density of this part. In response to this, at the light collection point of the laser beam 64, the material composing the substrate 11 (herein, sapphire) is modified due to expansion, contraction, decomposition or the like, which causes generation of a crack and the like, to thereby form a first modified portion La at the part having the first depth D1. The length, in the z direction, of the first modified portion La formed by the first scan is hereinafter referred to as a first height H1.

In the first scan, every time irradiation with one pulse of the laser beam 64 is performed, the irradiation position of the laser beam 64 with respect to the element-group formation substrate 20 sequentially moves in the y direction or the −y direction. Thus, along with the first scan, plural first modified portions La are sequentially formed in the y direction or the −y direction, at positions having the first depth D1 in the substrate 11 of the element-group formation substrate 20. Each of arrays of the plural first modified portions La in the y direction is the first modified region L1. An interval between centers of two first modified portions La adjacent in the y direction is hereinafter referred to as a first interval I1.

Next, a description is given of the second scan in Step 206 and the second modified region L2 formed in the substrate 11 of the element-group formation substrate 20 by the second scan.

In the second scan, as shown in FIG. 7B, irradiation with the pulse-oscillating laser beam 64 is performed along a second scan line Sc2 extending from a start position S that is at the upper right of the element-group formation substrate 20 in the drawing and outside of the element-group formation substrate 20 to an end position E that is at the lower left of the element-group formation substrate 20 in the drawing and outside of the element-group formation substrate 20. The output of the laser beam 64 per one pulse in the second scan is referred to as a second output P2. By the sequential irradiation with the laser beam 64 along the second scan line Sc2, plural second modified regions L2 are sequentially formed in the element-group formation substrate 20 in the x direction and the −x direction from the U edge side to the D edge side so as to be parallel in the xy plane.

During the second scan, as shown in FIG. 8B, the laser beam 64 enters the element-group formation substrate 20 from the substrate back surface 11b side of the substrate 11. The laser beam 64 incident on the substrate 11 in the second scan is collected at a part of the substrate 11 having the second depth D2, which increases the energy density of this part. In response to this, at the light collection point of the laser beam 64, the material composing the substrate 11 (herein, sapphire) is modified due to expansion, contraction, decomposition or the like, which causes generation of a crack and the like, to thereby form a second modified portion Lb at the part having the second depth D2. The length, in the z direction, of the second modified portion Lb formed by the second scan is hereinafter referred to as a second height H2.

In the second scan, every time irradiation with one pulse of the laser beam 64 is performed, the irradiation position of the laser beam 64 with respect to the element-group formation substrate 20 sequentially moves in the x direction or the −x direction. Thus, along with the second scan, plural second modified portions Lb are sequentially formed in the x direction or the −x direction, at positions having the second depth D2 in the substrate 11 of the element-group formation substrate 20. Each of arrays of the plural second modified portions Lb in the x direction is the second modified region L2. An interval between centers of two second modified portions Lb adjacent in the x direction is hereinafter referred to as a second interval I2.

In the first scan of Step 204, the plural first modified regions L1 are formed in the y direction at positions having the first depth D1 as viewed from the substrate back surface 11b, while in the second scan of Step 206, the plural second modified regions L2 are formed in the x direction at positions having the second depth D2 shallower than the first depth D1 as viewed from the substrate back surface 11b. Thus, the first modified regions L1 and the second modified regions L2 are orthogonal as viewed from the z direction side, but actually have a "skew" relationship. The distance between a first modified region L1 and a second modified region L2 in the z direction is hereinafter referred to as a first-to-second gap G12.

Then, a description is given of the third scan in Step 208 and the third modified region L3 formed in the substrate 11 of the element-group formation substrate 20 by the third scan.

In the third scan, as shown in FIG. 7C, irradiation with the pulse-oscillating laser beam 64 is performed along a third scan line Sc3 extending from a start position S that is at the upper right of the element-group formation substrate 20 in the drawing and outside of the element-group formation substrate 20 to an end position E that is at the lower left of the element-group formation substrate 20 in the drawing and outside of the element-group formation substrate 20. The output of the laser beam 64 per one pulse in the third scan is referred to as a third output P3. By the irradiation with the laser beam 64 along the third scan line Sc3, plural third modified regions L3 are sequentially formed in the element-group formation substrate 20 in the y direction and the −y direction from the R edge side to the L edge side so as to be parallel in the xy plane. The path of the third scan line Sc3 with respect to the element-group formation substrate 20 is the same as that of the first scan line Sc1 in the first scan.

During the third scan, as shown in FIG. 8C, the laser beam 64 enters the element-group formation substrate 20 from the substrate back surface 11b side of the substrate 11. The laser beam 64 incident on the substrate 11 in the third scan is collected at a part of the substrate 11 having the third depth D3, which increases the energy density of this part. In response to this, at the light collection point of the laser beam 64, the material composing the substrate 11 (herein, sapphire) is modified due to expansion, contraction, decomposition or the like, which causes generation of a crack and the like, to thereby form a third modified portion Lc at the part having the third depth D3. The length, in the z direction, of the third modified portion Lc formed by the third scan is hereinafter referred to as a third height H3.

In the third scan, every time irradiation with one pulse of the laser beam 64 is performed, the irradiation position of the laser beam 64 with respect to the element-group formation substrate 20 sequentially moves in the y direction or the −y direction. Thus, along with the third scan, plural third modified portions Lc are sequentially formed in the y direction or the −y direction, at positions having the third depth D3 in the substrate 11 of the element-group formation substrate 20. Each of arrays of the plural third modified portions Lc in the y direction is the third modified region L3. An interval between centers of two third modified portions Lc adjacent in the y direction is hereinafter referred to as a third interval I3.

In the second scan of Step 206, the plural second modified regions L2 are formed in the x direction at positions having the second depth D2 as viewed from the substrate back surface 11b, while in the third scan of Step 208, the plural third modified regions L3 are formed in the y direction at positions having the third depth D3 shallower than the second depth D2 as viewed from the substrate back surface 11b. Thus, the second modified regions L2 and the third modified regions L3 are orthogonal as viewed from the z direction side, but actually have a "skew" relationship. The distance between a second modified region L2 and a third modified region L3 in the z direction is hereinafter referred to as a second-to-third gap G23.

Additionally, in the first scan of Step 204, the plural first modified regions L1 are formed in the y direction at positions having the first depth D1 as viewed from the substrate back surface 11b, while in the third scan of Step 208, the plural third modified regions L3 are formed in the y direction at positions having the third depth D3 shallower than the first depth D1 and the second depth D2 as viewed from the substrate back surface 11b. In addition, in this example, the first scan line Sc1 of the first scan and the third scan line Sc3 of the third scan are matched on the element-group formation substrate 20. Accordingly, the first modified region L1 and the third modified region L3 are formed so as to be parallel in the yz plane. Then, the distance between the first modified region L1 and the third modified region L3 in the z direction is the sum of the first-to-second gap G12 and the second-to-third gap G23. Additionally, there is a positional relationship in which the second modified region L2 passes between the first modified region L1 and the third modified region L3.

Finally, a description is given of the fourth scan in Step 210 and the fourth modified region L4 formed in the substrate 11 of the element-group formation substrate 20 by the fourth scan.

Figure 7D:
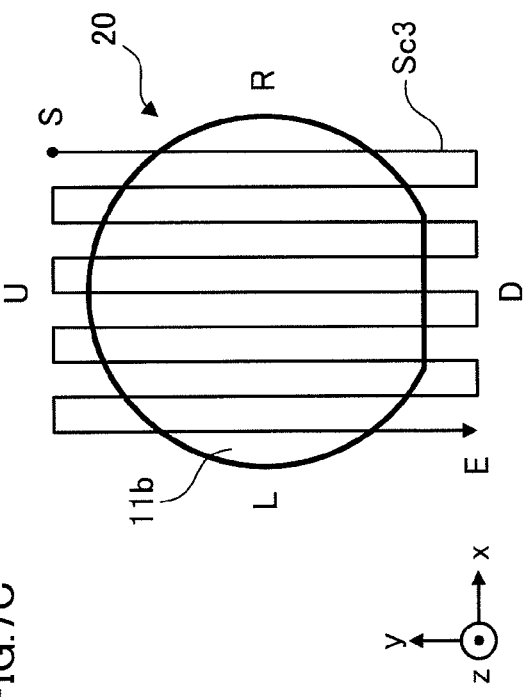

In the fourth scan, as shown in FIG. 7D, irradiation with the pulse-oscillating laser beam 64 is performed along a fourth scan line Sc4 extending from a start position S that is at the upper right of the element-group formation substrate 20 in the drawing and outside of the element-group formation substrate 20 to an end position E that is at the lower left of the element-group formation substrate 20 in the drawing and outside of the element-group formation substrate 20. The output of the laser beam 64 per one pulse in the fourth scan is referred to as a fourth output P4. By the sequential irradiation with the laser beam 64 along the fourth scan line Sc4, plural fourth modified regions L4 are sequentially formed in the element-group formation substrate 20 in the x direction and the −x direction from the U edge side to the D edge side so as to be parallel in the xy plane. The path of the fourth scan line Sc4 with respect to the element-group formation substrate 20 is the same as that of the second scan line Sc2 in the second scan.

During the fourth scan, as shown in FIG. 8D, the laser beam 64 enters the element-group formation substrate 20 from the substrate back surface 11b side of the substrate 11. The laser beam 64 incident on the substrate 11 in the fourth scan is collected at a part of the substrate 11 having the fourth depth D4, which increases the energy density of this part. In response to this, at the light collection point of the laser beam 64, the material composing the substrate 11 (herein, sapphire) is modified due to expansion, contraction, decomposition or the like, which causes generation of a crack and the like, to thereby form a fourth modified portion Ld at the part having the fourth depth D4. The length, in the z direction, of the fourth modified portion Ld formed by the fourth scan is hereinafter referred to as a fourth height H4.

In the fourth scan, every time irradiation with one pulse of the laser beam 64 is performed, the irradiation position of the laser beam 64 with respect to the element-group formation substrate 20 sequentially moves in the x direction or the −x direction. Thus, along with the fourth scan, plural fourth modified portions Ld are sequentially formed in the x direction or the −x direction, at positions having the fourth depth D4 in the substrate 11 of the element-group formation substrate 20. Each of arrays of the plural fourth modified portions Ld in the x direction is the fourth modified region L4. An interval between centers of two fourth modified portions Ld adjacent in the x direction is hereinafter referred to as a fourth interval I4.

In the third scan of Step 208, the plural third modified regions L3 are formed in the y direction at positions having the third depth D3 as viewed from the substrate back surface 11b, while in the fourth scan of Step 210, the plural fourth modified regions L4 are formed in the x direction at positions having the fourth depth D4 shallower than the third depth D3 as viewed from the substrate back surface 11b. Thus, the third modified regions L3 and the fourth modified regions L4 are orthogonal as viewed from the z direction side, but actually have a "skew" relationship. The distance between a third modified region L3 and a fourth modified region L4 in the z direction is hereinafter referred to as a third-to-fourth gap G34.

Additionally, in the second scan of Step 206, the plural second modified regions L2 are formed in the x direction at positions having the second depth D2 as viewed from the substrate back surface 11b, while in the fourth scan of Step 210, the plural fourth modified regions L4 are formed in the x direction at positions having the fourth depth D4 shallower than the first depth D1 to the third depth D3 as viewed from the substrate back surface 11b. In addition, in this example, the second scan line Sc2 of the second scan and the fourth scan line Sc4 of the fourth scan are matched on the element-group formation substrate 20. Accordingly, the second modified region L2 and the fourth modified region L4 are formed so as to be parallel in the xz plane. Then, the distance between the second modified region L2 and the fourth modified region L4 in the z direction is the sum of the second-to-third gap G23 and the third-to-fourth gap G34. Additionally, there is a positional relationship in which the third modified region L3 passes between the second modified region L2 and the fourth modified region L4.

Performing the first scan to the fourth scan according to the above-described procedure leads to formation of the first modified region L1 to the fourth modified region L4 inside of the substrate 11 in the element-group formation substrate 20. The first modified region L1 and the third modified region L3 are formed so that these regions overlap with each other as viewed from the xy plane and each lie in the y direction to pass through the line to be cut (the y direction) for each of the semiconductor light emitting elements 21. On the other hand, the second modified region L2 and the fourth modified region L4 are formed so that these regions overlap with each other as viewed from the xy plane and each lie in the x direction to pass through the line to be cut (the x direction) for each of the semiconductor light emitting elements 21.

In the present exemplary embodiment, the first output P1 of the laser beam 64 in the first scan is set to have the same magnitude as that of the second output P2 of the laser beam 64 in the second scan. Thus, the first height H1 of the first modified portions La formed in the substrate 11 by the first scan is substantially equal to the second height H2 of the second modified portions Lb formed in the substrate 11 by the second scan. Additionally, in the present exemplary embodiment, the third output P3 of the laser beam 64 in the third scan is set to be smaller than the second output P2 of the laser beam 64 in the second scan. Thus, the third height H3 of the third modified portions Lc formed in the substrate 11 by the third scan is lower than the second height H2 of the second modified portions Lb formed in the substrate 11 by the second scan. Furthermore, in the present exemplary embodiment, the third output P3 of the laser beam 64 in the third scan is set to have the same magnitude as that of the fourth output P4 of the laser beam 64 in the fourth scan. Thus, the third height H3 of the third modified portions Lc formed in the substrate 11 by the third scan is substantially equal to the fourth height H4 of the fourth modified portions Ld formed in the substrate 11 by the fourth scan.

Note that, in the present exemplary embodiment, if the y direction is regarded as "one direction," the first output P1 and the third output P3 correspond to "a predetermined output" and "one other output," respectively. In this case, the first modified portions La composing the first modified region L1 and the third modified portions Lc composing the third modified region L3 correspond to "front-side modified portions" and "back-side modified portions," respectively. Accordingly, the first interval I1 and the third interval I3 correspond to "an interval of the front-side modified portions" and "an interval of the back-side modified portions," respectively.

Meanwhile, if the x direction regarded as "one direction," the second output P2 and the fourth output P4 correspond to "a predetermined output" and "one other output," respectively. In this case, the second modified portions Lb composing the second modified region L2 and the fourth modified portions Ld composing the fourth modified region L4 correspond to "front-side modified portions" and "back-side modified portions," respectively. Accordingly, the second interval I2 and the fourth interval I4 correspond to "an interval of the front-side modified portions" and "an interval of the back-side modified portions," respectively.

In the present exemplary embodiment, the first-to-second gap G12, which is the distance in the z direction between the first modified region L1 and the second modified region L2 adjacent to each other in the z direction, is set to be larger than a half of the sum of the first height H1 of the first modified portions La composing the first modified region L1 and the second height H2 of the second modified portions Lb composing the second modified region L2 (G12>(H1+H2)/2). Thereby, the first modified portions La and the second modified portions Lb are less likely to merge at intersections, as viewed from the xy plane, of the first modified region L1 and the second modified region L2 that are adjacent in the z direction.

Additionally, in the present exemplary embodiment, the second-to-third gap G23, which is the distance in the z direction between the second modified region L2 and the third modified region L3 adjacent to each other in the z direction, is set to be larger than a half of the sum of the second height H2 of the second modified portions Lb composing the second modified region L2 and the third height H3 of the third modified portions Lc composing the third modified region L3 (G23>(H2+H3)/2). Thereby, the second modified portions Lb and the third modified portions Lc are less likely to merge at intersections, as viewed from the xy plane, of the second modified region L2 and the third modified region L3 that are adjacent in the z direction.

Furthermore, in the present exemplary embodiment, the third-to-fourth gap G34, which is the distance in the z direction between the third modified region L3 and the fourth modified region L4 adjacent to each other in the z direction, is set to be larger than a half of the sum of the third height H3 of the third modified portions Lc composing the third modified region L3 and the fourth height H4 of the fourth modified portions Ld composing the fourth modified region L4 (G34>(H3+H4)/2). Thereby, the third modified portions Lc and the fourth modified portions Ld are less likely to merge at intersections, as viewed from the xy plane, of the third modified region L3 and the fourth modified region L4 that are adjacent in the z direction.

In the present exemplary embodiment, the first interval I1 of the first modified portions La formed in the substrate 11 by the first scan is substantially equal to the second interval I2 of the second modified portions Lb formed in the substrate 11 by the second scan. Additionally, in the present exemplary embodiment, the third interval I3 of the third modified portions Lc formed in the substrate 11 by the third scan is narrower than the second interval I2 of the second modified portions Lb formed in the substrate 11 by the second scan. Furthermore, in the present exemplary embodiment, the third interval I3 of the third modified portions Lc formed in the substrate 11 by the third scan is substantially equal to the fourth interval I4 of the fourth modified portions Ld formed in the substrate 11 by the fourth scan.

By this configuration, as for the first modified region L1 and the third modified region L3 formed in the y direction, the third modified region L3 lying closer to the substrate back surface 11b has the modified portions that are formed at shorter intervals (pitch) than the first modified region L1 lying closer to the substrate front surface 11a (the stacked semiconductor layer 12). Meanwhile, as for the second modified region L2 and the fourth modified region L4 formed in the x direction, the fourth modified region L4 lying closer to the substrate back surface 11b has the modified portions that are formed at shorter intervals (pitch) than the second modified region L2 lying closer to the substrate front surface 11a (the stacked semiconductor layer 12).

Note that the first modified portions La composing the first modified region L1, the second modified portions Lb composing the second modified region L2, the third modified portions Lc composing the third modified region L3 and the fourth modified portions Ld composing the fourth modified region L4 have lower mechanical strength of the substrate 11 than those before the modification.

Figure 10:
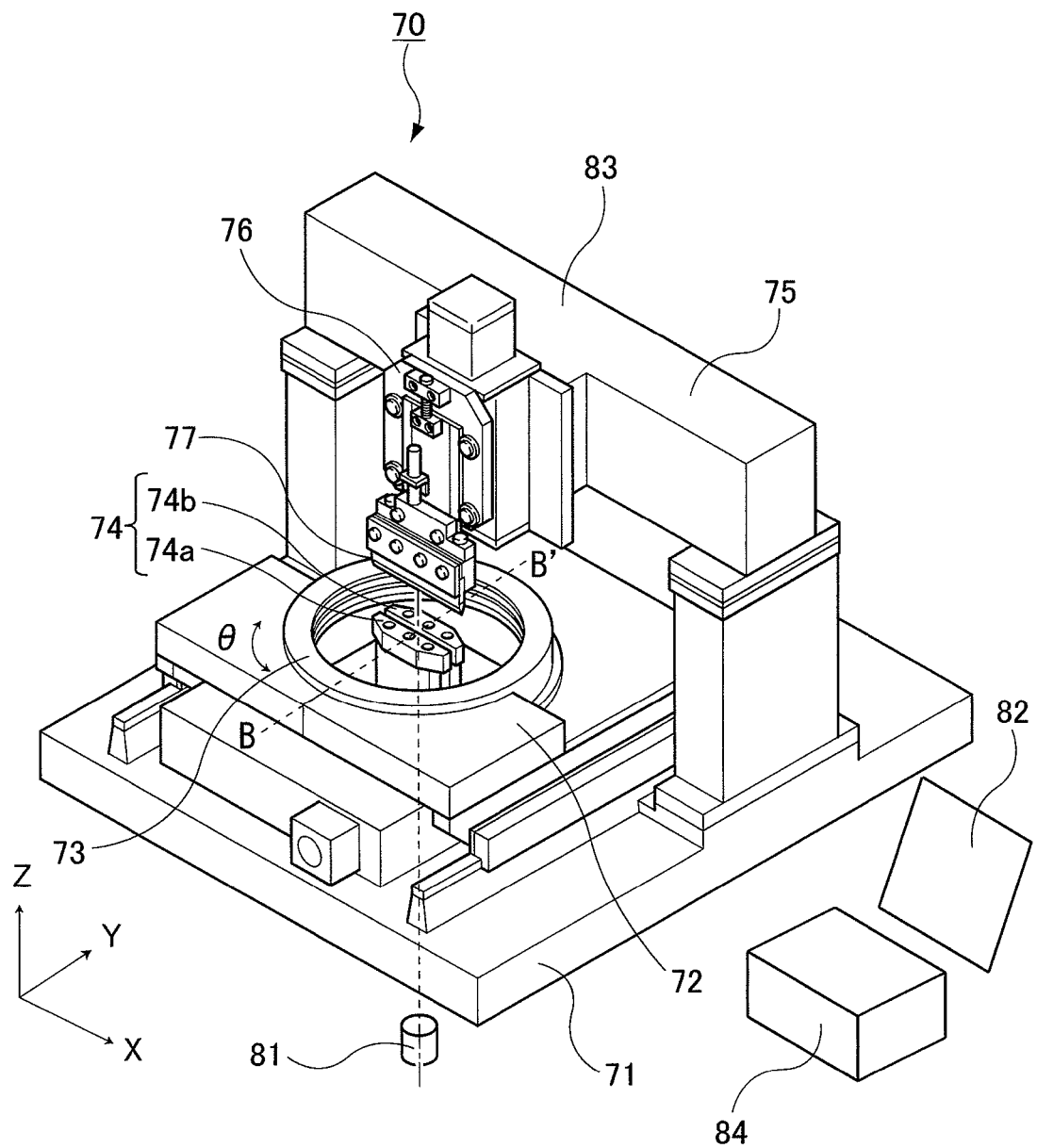
FIG. 10 is a perspective view showing a configuration example of a substrate cutting apparatus used in the cutting step.

FIG. 10 is a perspective view showing a configuration example of a substrate cutting apparatus 70 used in the cutting step of Step 300.

The substrate cutting apparatus 70 includes: a base 71 for installation on a platform or the like; and a stage 72 that is provided on the base 71 and movable on the base 71 in a front-back direction (which is referred to as a Y direction in the following description). The stage 72 has a ring table 73 that is formed of a ring-like frame rotatable on the stage 72 (the rotation direction is referred to as a θ direction in the following description). The ring table 73 is installed with the substrate unit 30 in which the first modified region L1 to the fourth modified region L4 are formed in the element-group formation substrate 20 through the modified region formation step of Step 200. The substrate cutting apparatus 70 further includes a receiving mount 74 that is attached to the base 71 and holds the element-group formation substrate 20 constituting the substrate unit 30 through the adhesive sheet 31 by being arranged inside of the ring of the ring table 73.

Note that, in the cutting step, processing to cover with another sheet (a holding sheet) the top surface side of the substrate unit 30, namely, the substrate back surface 11b side of the substrate 11 constituting the element-group formation substrate 20 is performed before the substrate unit 30 is attached to the substrate cutting apparatus 70, as will be described later.

Additionally, the substrate cutting apparatus 70 includes: a gate-like support 75 provided for the base 71; and a blade holder 76 supported by the support 75. The blade holder 76 holds a blade 77 at the lower-side edge. While holding the blade 77, the blade holder 76 is supported by the support 75 so as to be movable in an up-and-down direction (which is referred to as a Z direction in the following description) with respect to the base 71.

In the present exemplary embodiment, the blade 77 has a function to cut the element-group formation substrate 20 by being pushed into the element-group formation substrate 20 provided for the installed substrate unit 30. Thus, the blade 77 has a shape of a knife with a 60 degree tip, for example, and is made of superhard steel alloy, zirconia or the like, for example. The length of the blade 77 in the X direction is configured to be larger than the diameter of the element-group formation substrate 20.

The receiving mount 74 is composed of a first receiving mount 74a and a second receiving mount 74b arranged to face each other. The front surfaces of the first receiving mount 74a and the second receiving mount 74b are made of superhard steel alloy, for example, so as not to deform easily when the blade 77 is pushed into the element-group formation substrate 20. The receiving mount 74 is configured so that the blade 77 goes into the gap between the first receiving mount 74a and the second receiving mount 74b when the blade 77 is moved in the direction to the receiving mount 74 (the −Z direction).

Furthermore, the front surface of the ring table 73 and that of the receiving mount 74 are set so as to be located in substantially one plane (the XY plane).

The substrate cutting apparatus 70 also includes an image pickup section 81 composed of a CCD camera and the like, for example, at a lower portion of the receiving mount 74. The image pickup section 81 is configured to be capable of picking up images of the element-group formation substrate 20 on the receiving mount 74 through the gap between the first receiving mount 74a and the second receiving mount 74b. The substrate cutting apparatus 70 further includes a displaying section 82 that displays image data picked up by the image pickup section 81.

Additionally, in the support 75, the substrate cutting apparatus 70 includes a driving section 83 that is composed of a stepping motor for moving the blade holder 76 in the Z direction, a motor for moving the stage 72 in the Y direction, a motor for rotating the ring table 73 in the θ direction, an electronic circuit to control these motors, and the like.

In addition, the substrate cutting apparatus 70 further includes a controlling section 84 that extracts a pair of targets adjacent to each other with a line to be cut (in this example, the first modified region L1 and the third modified region L3 lying in the y direction of the element-group formation substrate 20, or the second modified region L2 and the fourth modified region L4 lying in the x direction of the element-group formation substrate 20) interposed therebetween from the image data picked up by the image pickup section 81, measures the distance between the targets, determines the cutting situation based on the amount of change of the distance between the targets, and controls operations of the components through the driving section 83.

Now, the above-described cutting step of Step 300 is described more specifically.

Figure 11:
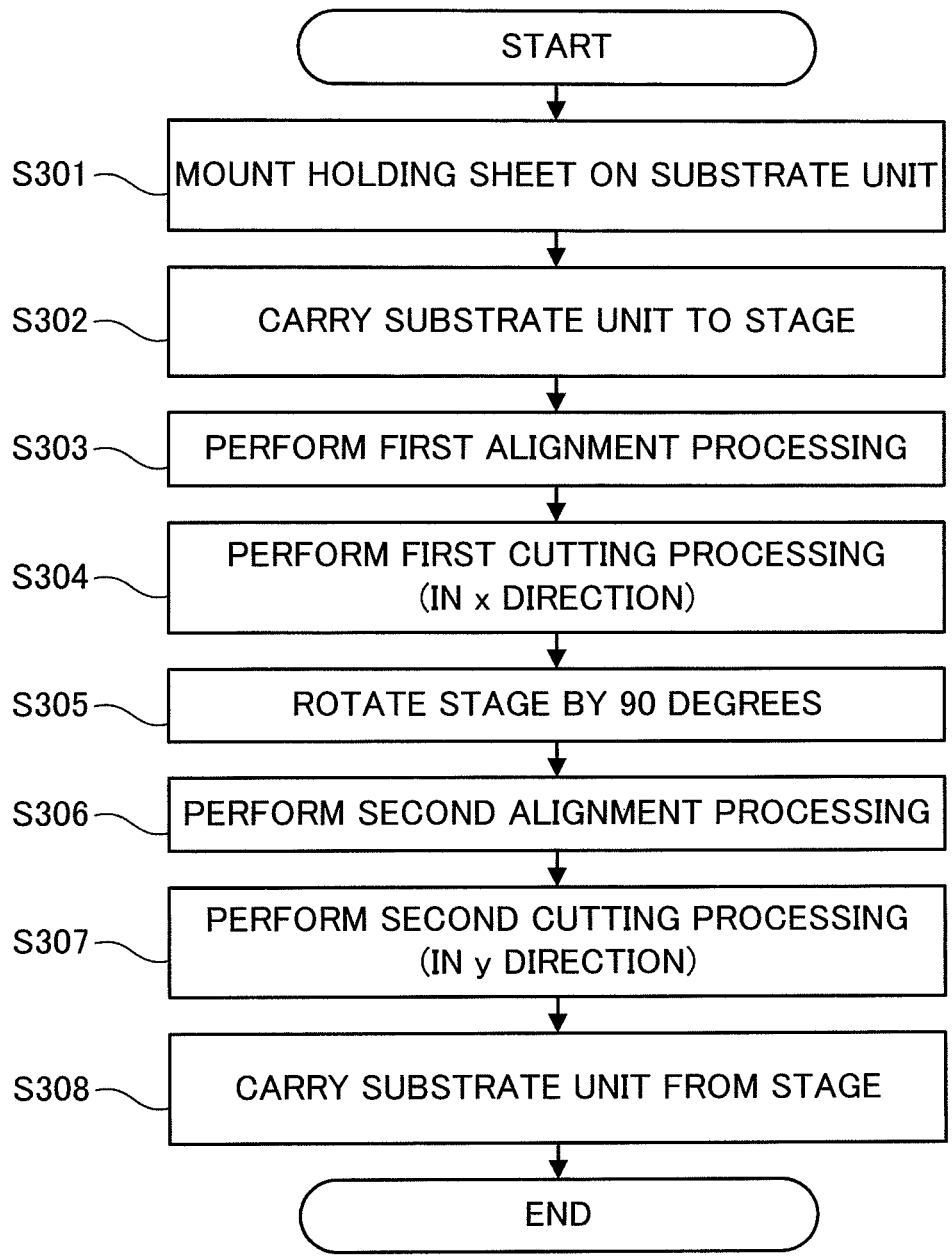
FIG. 11 is a flowchart showing an example of a processing procedure when the cutting step is performed by using the substrate cutting apparatus.

FIG. 11 is a flowchart showing an example of a processing procedure when the cutting step of Step 300 is performed by using the substrate cutting apparatus 70 shown in FIG. 10.

Now, according to the flowchart shown in FIG. 11, a description is given of the cutting step, with reference to FIGS. 4A, 4B and 10.

First, the holding sheet 33 (see FIG. 12A to be described later) is mounted on the substrate unit 30 that has already been subjected to the processing of the modified region formation step of Step 200 so as to cover the whole surface on the substrate back surface 11b side of the substrate 11 of the element-group formation substrate 20 (Step 301).

Next, in the substrate cutting apparatus 70, the controlling section 84 causes an unillustrated robot arm to carry the substrate unit 30 having the holding sheet 33 mounted thereon (the substrate unit 30 including the holding sheet 33 is hereinafter referred to simply as the substrate unit 30) from outside to the stage 72 (Step 302). On the basis of the result of picking-up by the image pickup section 81, the controlling section 84 then moves the stage 72 in the Y direction and rotates the stage 72 in the θ direction, to thereby perform first alignment processing for adjusting the x direction of the element-group formation substrate 20 provided for the substrate unit 30 to the X direction of the base 71 (Step 303).

Then, the controlling section 84 repeats movement of the blade 77 in the −Z direction and the Z direction through the blade holder 76 and movement of the substrate unit 30 (the element-group formation substrate 20) in the Y direction through the stage 72, to thereby perform first cutting processing for cutting the element-group formation substrate 20 along the line to be cut in the x direction (herein, the second modified region L2 and the fourth modified region L4 correspond thereto) (Step 304). At this time, the blade 77 sequentially applies pressure to the element-group formation substrate 20 in the x direction from the substrate back surface 11b side of the substrate 11.

When the first cutting processing is completed, the controlling section 84 then rotates the substrate unit 30 (the element-group formation substrate 20) through the stage 72 by 90 degrees (Step 305). On the basis of the result of picking-up by the image pickup section 81, the controlling section 84 then moves the stage 72 in the Y direction and rotates the stage 72 in the θ direction, to thereby perform second alignment processing for adjusting the y direction of the element-group formation substrate 20 provided for the substrate unit 30 to the X direction of the base 71 (Step 306).

After that, the controlling section 84 repeats movement of the blade 77 in the −Z direction and the Z direction through the blade holder 76 and movement of the substrate unit 30 (the element-group formation substrate 20) in the Y direction through the stage 72, to thereby perform second cutting processing for cutting the element-group formation substrate 20 along the line to be cut in the y direction (herein, the first modified region L1 and the third modified region L3 correspond thereto) (Step 307). At this time, the blade 77 sequentially applies pressure to the element-group formation substrate 20 in the y direction from the substrate back surface 11b side of the substrate 11.

Through the above process, the element-group formation substrate 20 provided for the substrate unit 30 is cut in the x direction and the y direction, thereby being cut into pieces and giving the plural element chips 10 (see FIG. 1). In the present exemplary embodiment, in the substrate unit 30, the formation surface side of the plural semiconductor light emitting elements 21 of the element-group formation substrate 20 before cutting is stuck on the adhesive sheet 31. In addition, the substrate 11 side (the substrate back surface 11b side) of the element-group formation substrate 20 before cutting is covered with the holding sheet 33. Thus, the plural element chips 10 cut into pieces by the cutting are unlikely to flying out from the substrate unit 30.

After the second cutting processing is completed, the controlling section 84 causes the unillustrated robot arm to carry the substrate unit 30 having been mounted on the stage 72 from the stage 72 to outside (Step 308), and then a series of processes is completed. Note that, if the next substrate unit 30 is prepared, the process returns to Step 301 and continues.

Next, a description is given of the first cutting processing in Step 304 and the second cutting processing in Step 307.

Figure 12A:
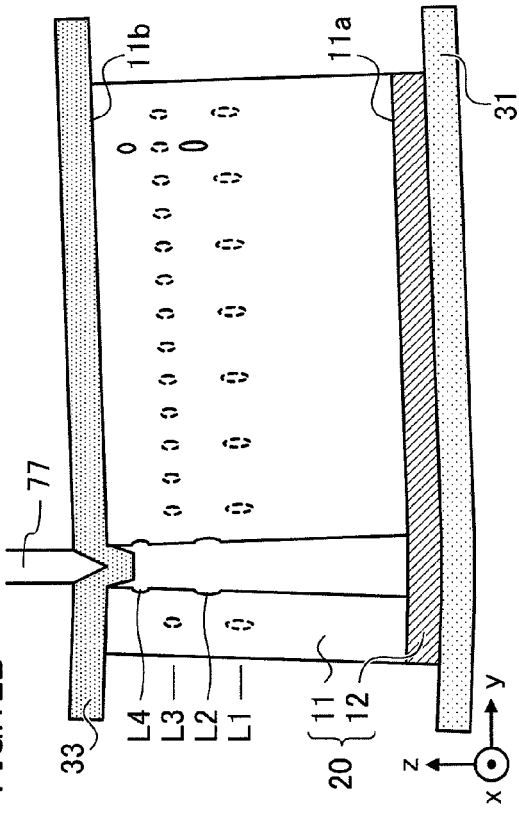
FIGS. 12A to 12D are diagrams showing an example of the first cutting processing and the second cutting processing in the cutting step.
Figure 12B:
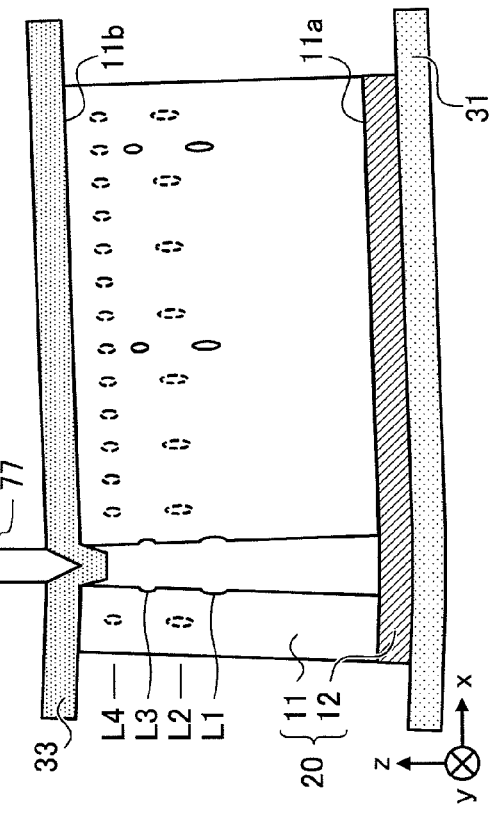
Figure 12C:
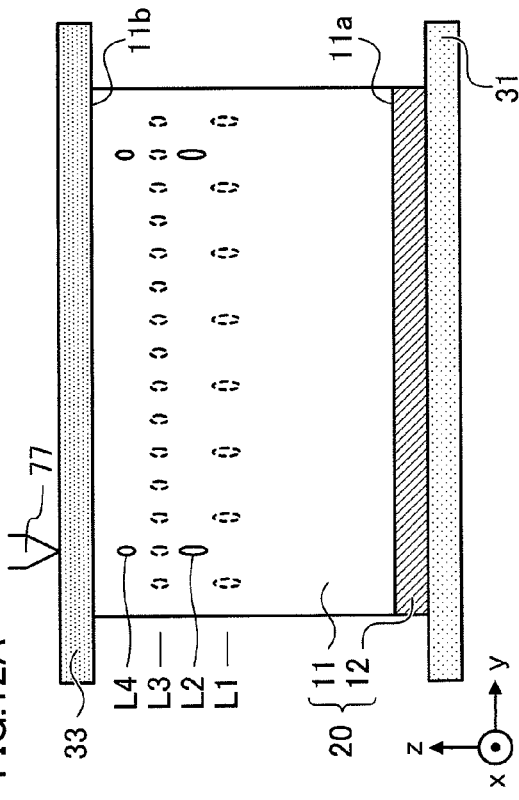
Figure 12D:
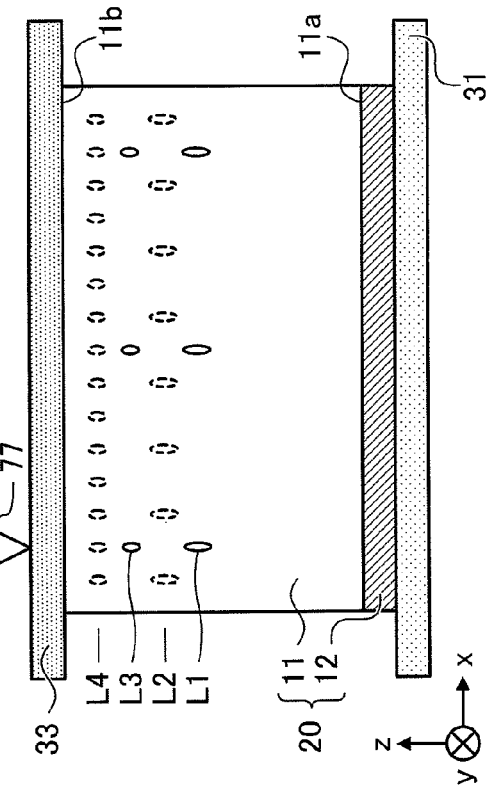

FIGS. 12A to 12D are diagrams showing an example of the first cutting processing in Step 304 and the second cutting processing in Step 307 in the cutting step. FIGS. 12A and 12B are for illustrating the first cutting processing, while FIGS. 12C and 12D are for illustrating the second cutting processing. Note that FIGS. 12A to 12D almost omit the configuration of the substrate cutting apparatus 70 side and only show the blade 77.

As described above, in the cutting step, the holding sheet 33 is covered on the substrate back surface 11b of the substrate 11 of the element-group formation substrate 20.

The holding sheet 33 does not need to have adhesion like the adhesive sheet 31, and may be composed of various resin materials, for example. In the present exemplary embodiment, polyethylene terephthalate (PET) having high stiffness is used as the holding sheet.

Now, a description is given of the first cutting processing in Step 304.

In the first cutting processing, the tip side of the blade 77 is arranged in the x direction of the element-group formation substrate 20, as shown in FIG. 12A. Additionally, in the first cutting processing, the tip side of the blade 77 faces the position just above of the second modified region L2 and the fourth modified region L4 in the element-group formation substrate 20 that each are formed in the x direction and formed so as to align in the z direction on the xz plane.

When the blade 77 moves down in the −z direction in this state, the tip side of the blade 77 is bumped against the holding sheet 33. Then, pressure applied in the −z direction from the tip side of the blade 77 lying in the x direction is also applied to the element-group formation substrate 20 through the holding sheet 33. At this time, on the −z direction side of (just below) the tip side of the blade 77, there is the fourth modified region L4 that lies in the x direction and has lower strength than the other part, and further, on the −z direction side of (just below) the fourth modified region L4, there is the second modified region L2 that lies in the x direction and has lower strength than the other part.

Thus, pressurizing the element-group formation substrate 20 in the −z direction with the blade 77 in this state divides the substrate 11 along the xz plane with the fourth modified region L4 and the second modified region L2 used as base points, as shown in FIG. 12B. Since the stacked semiconductor layer 12 is sufficiently thin as compared with the substrate 11, the element-group formation substrate 20 will also be divided along the xz plane together with the division of the substrate 11 along the xz plane.

Subsequently, a description is given of the second cutting processing in Step 307.

In the second cutting processing, the tip side of the blade 77 is arranged in the y direction of the element-group formation substrate 20, as shown in FIG. 12C. Additionally, in the second cutting processing, the tip side of the blade 77 faces the position just above of the first modified region L1 and the third modified region L3 in the element-group formation substrate 20 that each are formed in the y direction and formed so as to align in the z direction on the yz plane.

When the blade 77 moves down in the −z direction in this state, the tip side of the blade 77 is bumped against the holding sheet 33. Then, pressure applied in the −z direction from the tip side of the blade 77 lying in the y direction is also applied to the element-group formation substrate 20 through the holding sheet 33. At this time, on the −z direction side of (just below) the tip side of the blade 77, there is the third modified region L3 that lies in the y direction and has lower strength than the other part, and further, on the −z direction side of (just below) the third modified region L3, there is the first modified region L1 that lies in the y direction and has lower strength than the other part.

Thus, pressurizing the element-group formation substrate 20 in the −z direction with the blade 77 in this state divides the substrate 11 along the yz plane with the third modified region L3 and the first modified region L1 used as base points, as shown in FIG. 12D. Since the stacked semiconductor layer 12 is sufficiently thin as compared with the substrate 11, the element-group formation substrate 20 will also be divided along the yz plane together with the division of the substrate 11 along the yz plane.

Through these processes, the element chips 10 shown in FIG. 1 are obtained.

Figure 13:
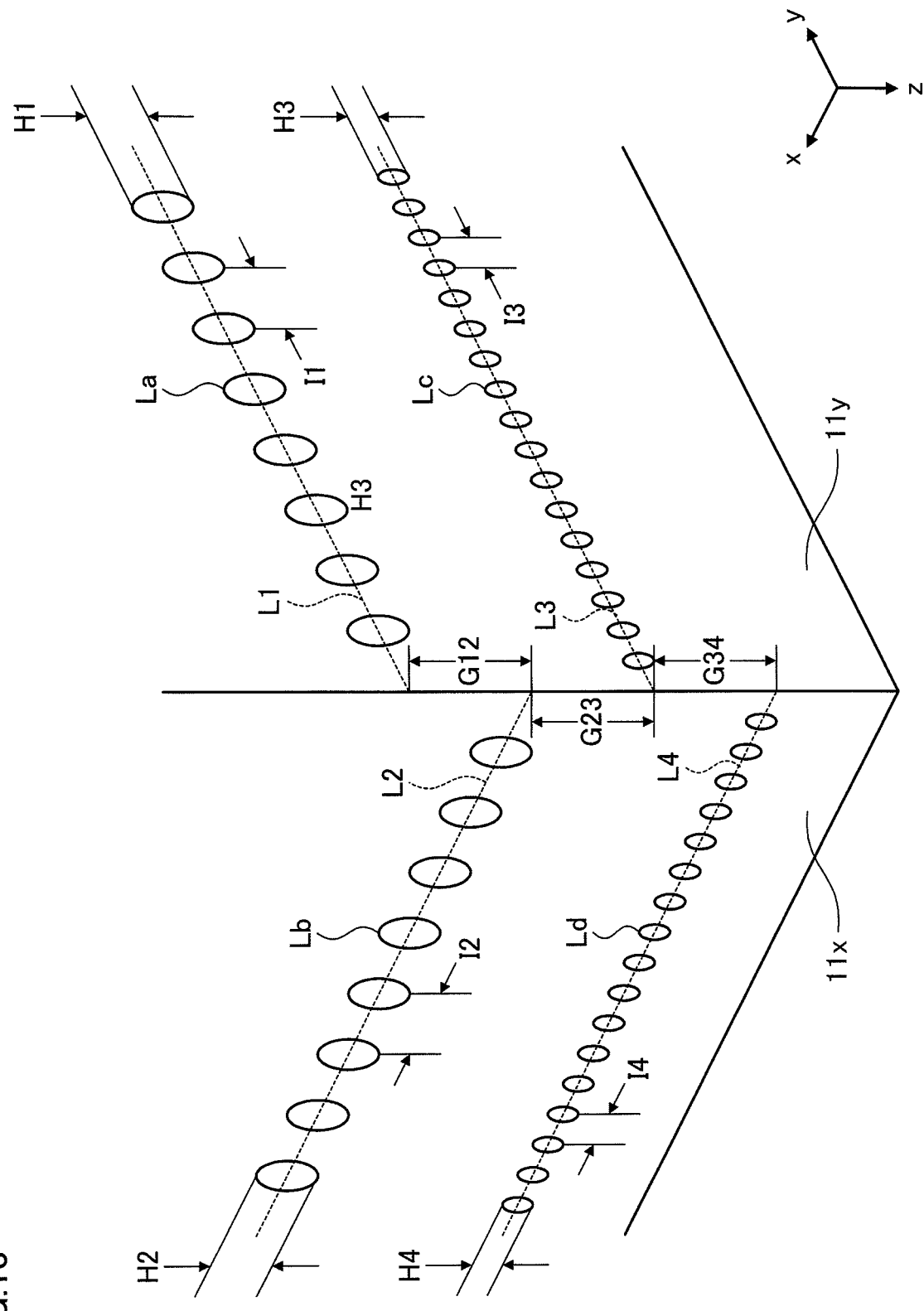
FIG. 13 is an enlarged perspective view showing an example of a cross-sectional structure of the substrate in the element chip obtained through the element-group formation step, the modified region formation step and the cutting step.

FIG. 13 is an enlarged perspective view showing an example of a cross-sectional structure of the substrate 11 in the element chip 10 (see FIG. 1) obtained through the element-group formation step of Step 100, the modified region formation step of Step 200 and the cutting step of Step 300.

In the present exemplary embodiment, the element-group formation substrate 20 is divided and cut into pieces by using the first modified regions L1 to the fourth modified regions L4 formed by the above-described procedure. Thus, the first modified region L1 and the third modified region L3 are exposed on the substrate longer-side surface 11y side of the substrate 11 in the element chip 10, while the second modified region L2 and the fourth modified region L4 are exposed on the substrate shorter-side surface 11x side thereof. Additionally, as described above, the first modified region L1, the second modified region L2, the third modified region L3 and the fourth modified region L4 are respectively composed of the plural first modified portions La aligning in the y direction, the plural second modified portions Lb aligning in the x direction, the plural third modified portions Lc aligning in the y direction and the plural fourth modified portions Ld aligning in the x direction.

As has been described above, in the present exemplary embodiment, the first modified region L1 to the fourth modified region L4 are formed in the order from the side of the substrate 11 close to the substrate front surface 11a to the side far therefrom (from the side far from the substrate back surface 11b to the side close thereto), namely, in the order of the first modified region L1, the second modified region L2, the third modified region L3 and the fourth modified region L4, in the modified region formation step of forming, inside of the substrate 11, the first modified region L1 and the third modified region L3 extending in the y direction (corresponding to the first direction) along a surface of the substrate 11 and the second modified region L2 and the fourth modified region L4 extending in the x direction (corresponding to the second direction) different from the y direction along a surface of the substrate 11, by irradiating the element-group formation substrate 20 with the laser beam 64 from the substrate back surface 11b side of the substrate 11, the element-group formation substrate 20 having the plural semiconductor light emitting elements 21 formed on the substrate front surface 11a of the wafer-like substrate 11. Among these regions, when the first modified region L1 and the third modified region L3 extending in the y direction are formed, the strength (the third output P3) of the laser beam 64 to form the third modified region L3 farther from the semiconductor light emitting element 21 in the substrate 11 is made to be smaller than the strength (the first output P1) thereof to form the first modified region L1 closer to the semiconductor light emitting element 21 in the substrate 11. Meanwhile, also when the second modified region L2 and the fourth modified region L4 extending in the x direction are formed, the strength (the fourth output P4) of the laser beam 64 to form the fourth modified region L4 farther from the semiconductor light emitting element 21 in the substrate 11 is made to be smaller than the strength (the second output P2) thereof to form the second modified region L2 closer to the semiconductor light emitting element 21 in the substrate 11.

Focusing on the first modified region L1 and the third modified region L3, for example, formed in the y direction, the third modified region L3 is formed after the first modified region L1 is formed. When irradiation with the laser beam 64 at the third output P3 is performed to form the third modified region L3, some of the power of the laser beam 64 is used for the formation of the third modified portions Lc composing the third modified region L3. However, the remainder of the power of the laser beam 64 is not used for the formation of the third modified portions Lc but just passes through the third modified portions Lc. In this example, since the first modified portions La extending in the z direction have already been formed above the third modified portions Lc (on the −z direction side), that part of the laser beam 64 which has not been used for the formation of the third modified portions Lc passes through the inside of the first modified portions La (space made by a crack) while being hardly attenuated. Then, the stacked semiconductor layer 12 provided on the substrate front surface 11a side is irradiated with the laser beam 64 that has been collected to form the third modified portions Lc and further passed through the first modified portions La while having a small amount of energy attenuation.

If the stacked semiconductor layer 12 is irradiated with the laser beam 64 having insufficient energy attenuation in this manner, a phenomenon referred to as a so-called "burn" occurs at an irradiated part in the stacked semiconductor layer 12 in which the stacked semiconductor layer 12 is locally discolored or modified in response to absorption of the laser beam 64. If such a "burn" occurs, those having "a burn" among the plural element chips 10 obtained through the subsequent cutting step will fail a test due to poor appearance. Accordingly, occurrence of "a burn" may lead to a decrease in yield of the element chips 10.

Although a description herein has been given by taking the first modified region L1 and the third modified region L3 formed in the y direction as an example, a similar problem may occur also in the formation of the second modified region L2 and the fourth modified region L4 extending in the x direction.

In contrast, in the present exemplary embodiment, the above-described configuration can reduce the occurrence of "a burn" in the element-group formation substrate 20 when the plural modified regions are formed by using the laser beam 64 at the parts that extends in the same direction and have different depths.

In the present exemplary embodiment, the first depth D1 of the first modified region L1 that is first formed in the substrate 11 of the element-group formation substrate 20 is set to be less than a half of the substrate thickness Ts of the substrate 11 in the modified region formation step, and thus, in forming the first modified region L1 to the fourth modified region L4, the laser beam 64 heading to the stacked semiconductor layer 12 side without being used for the formation of the modified portions can be reached the stacked semiconductor layer 12 side with the energy density thereof decreased due to expansion of the spot, which can further reduce the occurrence of "a burn" in the element-group formation substrate 20.

Additionally, in the present exemplary embodiment, the relationship between the gap between two modified regions adjacent in the thickness direction (the z direction) of the substrate 11 and the heights of the modified portions composing these two modified regions is set according to a predetermined mathematical expression, and thus, it is likely to avoid a situation in which the modified portions of these two modified regions link in the thickness direction of the substrate 11 to merge with each other, which consequently can further reduce the occurrence of "a burn" in the element-group formation substrate 20.

Furthermore, in the present exemplary embodiment, as for the later-formed modified region of the two modified regions formed in the same direction, the output of the laser beam 64 is reduced while the interval between adjacent modified portions is narrowed as compared with that in the former-formed modified region, and thus, this can make poor division of the substrate 11 in the cutting step unlikely to occur, which consequently can reduce the decrease in yield of the element chips 10 on the occasion of dividing.

Note that, in the present exemplary embodiment, the four modified regions, namely, the first modified region L1 to the fourth modified region L4 are formed inside of the substrate 11 of the element-group formation substrate 20 in the modified region formation step so as to be alternate in the y direction and the x direction from the deeper side as viewed from the substrate back surface 11b. However, the configuration is not limited thereto.

FIGS. 14A and 14B are tables for listing configuration examples of the plural modified regions to which the present invention may be applied.

The present invention is also applicable to a case where three modified regions (the first modified region L1 to the third modified region L3) are formed as well as the case where four modified regions (the first modified region L1 to the fourth modified region L4) are formed as described in the present exemplary embodiment. FIG. 14A shows by example: combination patterns of the formation directions of modified regions in the case of forming four modified regions; magnitude relations of output of the laser beam 64 in forming the modified regions for these patterns; and further magnitude relations of intervals of the modified portions composing the modified regions for these patterns. Meanwhile, FIG. 14B shows by example: combination patterns of the formation directions of modified regions in the case of forming three modified regions; magnitude relations of output of the laser beam 64 in forming the modified regions for these patterns; and further magnitude relations of intervals of the modified portions composing the modified regions for these patterns.

FIG. 14A shows fourteen patterns ((1) to (14)) that are combinations of the formation directions of modified regions, as examples in which four modified regions (the first modified region L1 to the fourth modified region L4) are formed. In these examples, the modified regions are formed in order of the first modified region L1, the second modified region L2, the third modified region L3 and the fourth modified region L4. Additionally, in these examples, the first modified region L1, the second modified region L2, the third modified region L3 and the fourth modified region L4 are formed so as to have the first depth D1, the second depth D2, the third depth D3 and the fourth depth D4. The first depth D1, the second depth D2, the third depth D3 and the fourth depth D4 have a relationship of D1>D2>D3>D4.

As shown in FIG. 14A, in the present invention, it is necessary to configure the first modified region L1 to the fourth modified region L4 as a combination of one formed in the x direction and one formed in the y direction. Accordingly, a pattern in which all of the first modified region L1 to the fourth modified region L4 are formed in the x direction or the y direction is excluded from the present invention.

Additionally, as shown in FIG. 14A, as basic patterns in forming the four modified regions, there exist a first group (see (1), (2), (4) and (8)) in which three of the first modified region L1 to the fourth modified region L4 are formed in the x direction and the other one is formed in the y direction, a second group (see (3), (5), (6), (9), (10) and (12)) in which two of the regions are formed in the x direction and the other two are formed in the y direction, and a third group (see (7), (11), (13) and (14)) in which one of the regions is formed in the x direction and the other three are formed in the y direction. Among these groups, the second group includes a case ((5) and (10)) in which the x direction and the y direction are alternated in the z direction (the depth direction). Note that, in the present exemplary embodiment, the description has been given by taking the combination shown in (10) of FIG. 14A as an example.

In the examples shown in FIG. 14A, the first group can be used in a case where cutting in the x direction is more difficult than cutting in the y direction because of the crystal structure or the like of the substrate 11, for example. Additionally, the first group can be used in the case where cutting in the x direction is more difficult than cutting in the y direction because the element chips 10 have a structure of Cx>Cy, for example.

The second group can be used in a case where cutting in the x direction is as difficult as cutting in the y direction, for example. If a pattern of the second group is employed in which the x direction and the y direction are alternated in the z direction (the depth direction), it is possible to reduce the occurrence of a situation where the element-group formation substrate 20 cracks in the middle of the modified region formation step as compared with a case where those two modified regions of the first modified region L1 to the fourth modified region L4 which are adjacent in the z direction are configured in the same direction, for example. Thereby, it is possible to reduce the occurrence of a deviation of a modified region from the line to be cut, the deviation occurring when the modified region is further formed in the element-group formation substrate 20 having a crack, for example.

Additionally, the third group can be used in a case where cutting in the y direction is more difficult than cutting in the x direction because of the crystal structure or the like of the substrate 11, for example. Additionally, the third group can be used in the case where cutting in the y direction is more difficult than cutting in the x direction because the element chips 10 have a structure of Cx<Cy, for example.

Next, FIG. 14B shows six patterns ((1) to (6)) that are combinations of the formation directions of modified regions, as examples in which three modified regions are formed. In these examples, the modified regions are formed in order of the first modified region L1, the second modified region L2 and the third modified region L3. Additionally, in these examples, the first modified region L1, the second modified region L2 and the third modified region L3 are formed so as to have the first depth D1, the second depth D2 and the third depth D3. The first depth D1, the second depth D2 and the third depth D3 have a relationship of D1>D2>D3.

As shown in FIG. 14B, in the present invention, it is necessary to configure the first modified region L1 to the third modified region L3 as a combination of one formed in the x direction and one formed in the y direction. Accordingly, a pattern in which all of the first modified region L1 to the third modified region L3 are formed in the x direction or the y direction is excluded from the present invention.

Additionally, as shown in FIG. 14B, as basic patterns in forming the three modified regions, there exist a first group (see (1), (2) and (4)) in which two of the first modified region L1 to the third modified region L3 are formed in the x direction and the other one is formed in the y direction, and a second group (see (3), (5) and (6)) in which one of the regions is formed in the x direction and the other two are formed in the y direction. Both the first group and the second group include a case ((2) and (5)) in which the x direction and the y direction are alternated in the z direction (the depth direction).

In the examples shown in FIG. 14B, the first group can be used in a case where cutting in the x direction is more difficult than cutting in the y direction because of the crystal structure or the like of the substrate 11, for example. Additionally, the first group can be used in the case where cutting in the x direction is more difficult than cutting in the y direction because the element chips 10 have a structure of Cx>Cy, for example.

The second group can be used in a case where cutting in the y direction is more difficult than cutting in the x direction because of the crystal structure or the like of the substrate 11, for example. Additionally, the second group can be used in the case where cutting in the y direction is more difficult than cutting in the x direction because the element chips 10 have a structure of Cx<Cy, for example.

If a pattern is employed in which the x direction and the y direction are alternated in the z direction (the depth direction), it is possible to reduce the occurrence of a situation where the element-group formation substrate 20 cracks in the middle of the modified region formation step as compared with a case where those two modified regions of the first modified region L1 to the third modified region L3 which are adjacent in the z direction are configured in the same direction, for example. Thereby, it is possible to reduce the occurrence of a deviation of a modified region from the line to be cut, the deviation occurring when the modified region is further formed in the element-group formation substrate 20 having a crack, for example.

In the present exemplary embodiment, the pulse-oscillating YAG (Yttrium Aluminum Garnet) laser beam is used to form the modified regions; however, the present invention is not limited thereto. The wavelength of the laser beam used for the formation of the modified regions may also be changed in design as appropriate.

In the present exemplary embodiment, the substrate shorter-side surface 11x and the substrate longer-side surface 11y of the substrate 11 of the element chip 10 are configured to have a right angle to make the substrate front surface 11a and the substrate back surface 11b of the substrate 11 be rectangular. However, the configuration is not limited thereto, but the substrate front surface 11a and the substrate back surface 11b of the substrate 11 of the element chip 10 may be parallelogrammatic without making the angle between the substrate shorter-side surface 11x and the substrate longer-side surface 11y of the substrate 11 be a right angle.

Additionally, in the present exemplary embodiment, the description has been given by taking the semiconductor light emitting elements 21 as an example of electronic elements formed on the substrate 11; the electronic elements are not limited thereto, but may be those having no function of light emission.

The invention claimed is:

1. A method for laser processing, comprising the steps of:
   forming a front-side modified region inside of an element-group formation substrate having a plurality of electronic elements formed on a front surface of a plate-shaped substrate in one direction along a surface of the substrate by
      irradiating the element-group formation substrate sequentially with a laser beam having a predetermined output from a back surface side of the substrate in the one direction, and
      collecting the laser beam sequentially to a part inside of the substrate which part has a predetermined depth from the back surface; and
   forming a back-side modified region inside of the substrate along the front-side modified region by
      irradiating the element-group formation substrate sequentially with a laser beam having one other output smaller than the predetermined output from the back surface side of the substrate in the one direction along the surface of the substrate, the element-group formation substrate having the front-side modified region formed therein, and
      collecting the laser beam sequentially to a part inside of the substrate which part has one other depth from the back surface shallower than the predetermined depth.

2. The method for laser processing according to claim 1, wherein the step of forming the back-side modified region includes irradiating with the laser beam having the one other output so as to face the front-side modified region formed in the substrate.

3. The method for laser processing according to claim 2, wherein
   the step of forming the front-side modified region includes
      forming the front-side modified region composed by aligning a plurality of front-side modified portions by
      collecting the laser beam which is pulse-oscillating inside of the substrate, to form each of the front-side modified portions at a part having the predetermined depth, and
      moving an irradiation position of the laser beam on the substrate along the surface of the substrate, and
   the step of forming the back-side modified region includes
      forming the back-side modified region composed by aligning a plurality of back-side modified portions by
      collecting the laser beam which is pulse-oscillating inside of the substrate, to form each of the back-side modified portions at a part having the one other depth, and
      moving an irradiation position of the laser beam on the substrate along the surface of the substrate, wherein
   an interval between two of the back-side modified portions adjacent in the back-side modified region is made narrower than an interval between two of the front-side modified portions adjacent in the front-side modified region.

4. The method for laser processing according to claim 3, wherein the predetermined depth at which the front-side modified region is formed is set to be less than a half of a thickness of the substrate from the front surface to the back surface thereof in the step of forming the front-side modified region.

5. The method for laser processing according to claim 2, wherein the predetermined depth at which the front-side modified region is formed is set to be less than a half of a thickness of the substrate from the front surface to the back surface thereof in the step of forming the front-side modified region.

6. The method for laser processing according to claim 1, wherein
the step of forming the front-side modified region includes forming the front-side modified region composed by aligning a plurality of front-side modified portions by collecting the laser beam which is pulse-oscillating inside of the substrate, to form each of the front-side modified portions at a part having the predetermined depth, and
moving an irradiation position of the laser beam on the substrate along the surface of the substrate, and
the step of forming the back-side modified region includes forming the back-side modified region composed by aligning a plurality of back-side modified portions by collecting the laser beam which is pulse-oscillating inside of the substrate, to form each of the back-side modified portions at a part having the one other depth, and
moving an irradiation position of the laser beam on the substrate along the surface of the substrate, wherein
an interval between two of the back-side modified portions adjacent in the back-side modified region is made narrower than an interval between two of the front-side modified portions adjacent in the front-side modified region.

7. The method for laser processing according to claim 6, wherein the predetermined depth at which the front-side modified region is formed is set to be less than a half of a thickness of the substrate from the front surface to the back surface thereof in the step of forming the front-side modified region.

8. The method for laser processing according to claim 1, wherein the predetermined depth at which the front-side modified region is formed is set to be less than a half of a thickness of the substrate from the front surface to the back surface thereof in the step of forming the front-side modified region.

9. A method for laser processing to form, inside of an element-group formation substrate having a plurality of electronic elements formed on a front surface of a plate-shaped substrate, a plurality of modified regions extending in one direction along a surface of the substrate by irradiating the element-group formation substrate with a laser beam from a back surface side of the substrate, the method comprising the step of
forming the plurality of modified regions in the order from a side of the substrate close to the front surface toward a side thereof far from the front surface, while reducing an output of the laser beam at the time of forming each of the modified regions in the order from the side of the substrate close to the front surface toward the side thereof far from the front surface.

10. The method for laser processing according to claim 9, wherein the plurality of modified regions are formed so as to overlap with each other in a thickness direction of the substrate.

11. The method for laser processing according to claim 10, wherein
each of the plurality of modified regions is formed by moving the laser beam which is pulse-oscillating in the one direction, and
moving the laser beam which is pulse-oscillating in the one direction provides each of the plurality of modified regions composed of a plurality of modified portions aligning in the one direction, while intervals between adjacent ones of the modified portions in the one direction in each of the plurality of modified regions are narrowed as a distance from the front surface of the substrate increases.

12. The method for laser processing according to claim 11, wherein the plurality of modified regions are formed so as to be closer to the back surface of the substrate than a center in the thickness direction from the front surface of the substrate to the back surface thereof.

13. The method for laser processing according to claim 12, wherein
the substrate is formed of sapphire, and
each of the plurality of electronic elements includes a group III nitride semiconductor layer.

14. The method for laser processing according to claim 10, wherein the plurality of modified regions are formed so as to be closer to the back surface of the substrate than a center in the thickness direction from the front surface of the substrate to the back surface thereof.

15. The method for laser processing according to claim 10, wherein
the substrate is formed of sapphire, and
each of the plurality of electronic elements includes a group III nitride semiconductor layer.

16. The method for laser processing according to claim 9, wherein
each of the plurality of modified regions is formed by moving the laser beam which is pulse-oscillating in the one direction, and
moving the laser beam which is pulse-oscillating in the one direction provides each of the plurality of modified regions composed of a plurality of modified portions aligning in the one direction, while intervals between adjacent ones of the modified portions in the one direction in each of the plurality of modified regions are narrowed as a distance from the front surface of the substrate increases.

17. The method for laser processing according to claim 16, wherein the plurality of modified regions are formed so as to be closer to the back surface of the substrate than a center in the thickness direction from the front surface of the substrate to the back surface thereof.

18. The method for laser processing according to claim 16, wherein
the substrate is formed of sapphire, and
each of the plurality of electronic elements includes a group III nitride semiconductor layer.

19. The method for laser processing according to claim 9, wherein the plurality of modified regions are formed so as to be closer to the back surface of the substrate than a center in the thickness direction from the front surface of the substrate to the back surface thereof.

20. The method for laser processing according to claim 9, wherein
the substrate is formed of sapphire, and
each of the plurality of electronic elements includes a group III nitride semiconductor layer.

* * * * *